United States Patent [19]

Ouchi et al.

[11] Patent Number: 5,654,814
[45] Date of Patent: Aug. 5, 1997

[54] OPTICAL SEMICONDUCTOR APPARATUS AND OPTICAL COMMUNICATION SYSTEM USING THE APPARATUS

[75] Inventors: Toshihiko Ouchi, Machida; Takeo Ono, Sagamihara; Masao Majima, Isehara, all of Japan

[73] Assignee: Canon Kabushiki Kaisha, Tokyo, Japan

[21] Appl. No.: 563,356

[22] Filed: Nov. 28, 1995

Related U.S. Application Data

[63] Continuation of Ser. No. 124,004, Sep. 21, 1993, abandoned.

[30] Foreign Application Priority Data

Oct. 3, 1992 [JP] Japan ................................ 4-289550
Jul. 30, 1993 [JP] Japan ................................ 5-208268

[51] Int. Cl.$^6$ ................................................ H04B 10/00
[52] U.S. Cl. ........................ 359/156; 359/182; 359/188; 359/193; 359/195
[58] Field of Search ................................ 359/122, 130, 359/132, 152, 156, 160, 173, 179, 182, 188, 190, 192, 195, 246, 248, 344, 193; 385/2, 4, 8, 9, 10, 37; 372/27, 45, 50, 94

[56] References Cited

U.S. PATENT DOCUMENTS

| | | | |
|---|---|---|---|
| 4,918,701 | 4/1990 | Amann et al. | 372/50 |
| 5,008,958 | 4/1991 | Cimini, Jr. et al. | 455/619 |
| 5,020,153 | 5/1991 | Choa et al. | 359/189 |
| 5,031,236 | 7/1991 | Hodgkinson et al. | 455/619 |
| 5,117,469 | 5/1992 | Cheung et al. | 385/11 |
| 5,131,060 | 7/1992 | Sakata | 385/2 |
| 5,223,972 | 6/1993 | Nishimura et al. | 359/337 |
| 5,247,382 | 9/1993 | Suzuki | 359/156 |
| 5,299,045 | 3/1994 | Sekiguchi | 359/130 |
| 5,309,275 | 5/1994 | Nishimura et al. | 359/344 |
| 5,359,449 | 10/1994 | Nishimoto et al. | 359/181 |
| 5,379,142 | 1/1995 | Handa | 359/129 |
| 5,414,549 | 5/1995 | Nishimura et al. | 359/160 |
| 5,479,544 | 12/1995 | Ono et al. | 385/37 |
| 5,502,783 | 3/1996 | Wu | 385/42 |

OTHER PUBLICATIONS

I.P. Kaminow, et al., *Journal of Lightwave Technology*, FDM A–FSK Star Network with a Tunable Optical Filter Demultiplexer, vol. 6, No. 9, Sep. 1988, pp. 1406–1414.

M.J. Chawki, et al., *Electronics Letters*, FSK Transmission System Using Two Electrode DFB Laser as a Tunable FSK Discriminator/Photodetector, vol. 26, No. 15, Jul. 19, 1990, pp. 1101–1224.

K. Oda, et al., "Channel Selection Controller for Optical FDM Distribution Systems," 1989, OCS 89–65.

N. Shimosaka, et al., "A Photonic Wavelength–Divison and Time–Division Hybrid Multiplexed Network Using Acousto–optic Tunable Wavelength Filters For a Broadcasting Studio Application," 1991, OCS 91–83.

T. Numai, et al., "Semiconductor Tunable Wavelength Filters," 1989, OQE 88–65.

Ishikawa, et al., "LiNbO$_3$ Optical Waveguide Modulator for Bidirectional Transmission in Optical CATV Subscriber Systems," 1991, OCS 91–82.

Primary Examiner—Hezron E. Williams
Assistant Examiner—Richard A. Moller
Attorney, Agent, or Firm—Fitzpatrick, Cella, Harper & Scinto

[57] ABSTRACT

An optical semiconductor apparatus having no polarization dependency and an optical communication system using the semiconductor apparatus are provided. In an optical communication system wherein a signal is demultiplexed by using a semiconductor waveguide type filter disposed on a receiver side, two semiconductor lasers disposed on a transmitter side modulate two light signals having different wavelengths using a common modulation signal and transmit the modulated light signals. One of the different wavelengths is accorded, for example, to the TE mode transmission wavelength of the filter, and the other is accorded, for example, to the TM mode transmission wavelength of the filter. On the receiver side, lights at different wavelengths may be branched into two light portions and the branched light portions may be respectively detected by two photodetectors.

25 Claims, 19 Drawing Sheets

OPTICAL SEMICONDUCTOR APPARATUS AND OPTICAL COMMUNICATION SYSTEM USING THE APPARATUS

This application is a continuation of application Ser. No. 08/124,004, filed Sep. 21, 1993, now abandoned.

BACKGROUND OF THE INVENTION

1. Field of the Invention

The present invention relates to an optical semiconductor apparatus for solving the problem of polarization dependency in the field of optical frequency division multiplexing (FDM) communication, for example. The problem of polarization dependency arises when a recieving sensitivity fluctuates due to changes in the polarization state of signal light on the receiver side. The present invention also relates to an optical communication system and an apparatus using the above-mentioned optical semiconductor apparatus.

2. Related Background Art

In recent years, increased transmission capacity in the field of optical communications has become desirable, and the development of optical FDM communication, in which signals at a plurality of optical frequencies are multiplexed in a single optical fiber, has been advanced.

There are two kinds of optical FDM communication methods, which are classified by the type of light signal used in the receiving technique. One method is a coherent optical communication in which a beat signal is produced between signal light and light from a local oscillator to obtain an intermediate-frequency output, and that output is detected. The other method is one in which only light at a desired wavelength or optical frequency is selected by a tunable filter, and the thus-selected light is detected. The latter method, known as an optical-frequency changeable filtering method, will be described.

The tunable filter may comprise one of a Max-Zehnder type, a fiber Fabry-Perot type and an acousto-optic (AO) type, which have been respectively developed, but each has drawbacks.

In the Max-Zehnder filter type and the fiber Fabry-Perot filter type, the transmission bandwidth can be relatively freely designed and a width of several Å can be obtained, so that the frequency multiplicity of optical FDM communication can be increased. Further, there is a great advantage in that the polarization state of signal light does not adversely affect the quality of signal receiving. An example of a Max-Zehnder type filter is disclosed in K. Oda et al. "Channel Selection Characteristics of Optical FDM Filter", OCS 89-65, 1989. An example of a fiber Fabry-Perot type filter is disclosed in I. P. Kaminow et al. "FDMA-FSK Star Network with a Tunable Optical Filter Demultiplexer", IEEE J. Lightwave Technol., vol. 6, No. 9, p. 1406, September, 1988. Those filter types, however, have the disadvantages that considerable light loss exists and that downsizing of a receiver device is difficult because the integration of a semiconductor photodetector and the filter is impossible.

In the AO modulator filter type, the receiving control is easy since the transmission bandwidth is large, e.g., several tens of Å, but the multiplicity of transmitted wavelengths cannot be increased. An example of an AO modulator type filter is disclosed in N. Shimosaka et al. "A photonic wavelength division/time division hybrid multiplexed network using accoustic tunable wavelength filters for a broadcasting studio application", OCS 91-83, 1991. This filter type, however, has the drawbacks that light loss exists, that the integration with a semiconductor photodetector is impossible and that polarization control of signal light is necessary because the polarization state of signal light adversely affects the quality of signal receiving.

On the other hand, in a semiconductor filter type, e.g., a distributed feedback (DFB) filter provided with a diffraction grating formed in a light guide layer for single longitudinal mode operation, the transmission bandwidth can be narrowed (e.g., by several Å), the optical amplification function (approx. 20 dB) exists, the multiplicity of transmitted wavelengths can be increased and the minimum receiving sensitivity can be improved (i.e., the minimum receiving intensity can be reduced). An example of a semiconductor type filter is disclosed in T. Numai et al. "Semiconductor Tunable Wavelength Filter", OQE 88-65, 1988. Further, this type of filter can be formed with the same material as a semiconductor photodetector, so that integration and downsizing are feasible.

From the foregoing, the suitability of a semiconductor DFB type optical filter for optical FDM communications is clear.

The recent situation of signal modulation systems is as follows. At present, the most popular modulation system for transmission systems using optical filters is a digital amplitude modulation system or amplitude shift keying (ASK). There are two methods for implementing this type of modulation. One is a method in which current injected into a laser diode (LD) is directly modulated, and the other is a method in which an external intensity modulator is employed. The former method is not suitable for a high-density wavelength multiplicity since wavelength chirping (e.g., of several Å) occurs in the LD. The latter method has the drawback that the use of the external modulator entails light loss therein. For the foregoing reasons, a method has been developed in which a signal of a minute amplitude is superimposed on the injection current of an LD to effect a digital frequency modulation or frequency shift keying (FSK), and the demodulation is achieved by utilizing the wavelength discrimination characteristic of the optical filter. In this connection, reference should be made to M. J. Chawki et al. "1.5 Gbit/s FSK Transmission System Using Two Electrode DFB Laser As A Tunable FSK Discriminator/ Photodetector", Electron. Lett. Vol. 26 No. 15, 1990.

The DFB filter as shown in FIG. 1, however, has polarization dependency, which results from the fact that a tuned wavelength (i.e., the selected wavelength of light that is transmitted through the DFB filter) for light having an electric field component parallel to the layer surface of the device (TE mode) is different from a tuned wavelength for light having an electric field component perpendicular to the layer surface of the device (TM mode). The difference is caused by the following phenomenon. Since effective indices of the waveguide for TE and TM modes are different, the Bragg conditions of the diffraction grating, which are $$\lambda = 2n \Lambda/m$$

($\lambda$: wavelength of light, n: effective index, $\Lambda$: pitch of diffraction grating, m: integer or order of diffraction grating), deviate from each other between the TE and TM modes. In the filter shown in FIG. 1, there are arranged a waveguide 341, a grating 342 formed in the waveguide 341, three electrodes 343, 344 and 345 separated from each other along the light propagation direction, an active layer 346 and anti-reflection films 347 and 348 deposited on opposite end surfaces of the filter. The electrodes 343 and 345 at opposite end portions (active regions) serve to cause a signal gain, and they change the refractive index of the waveguide 341 by changing carrier densities therein and change the wavelength reflected by the grating 342 in a distributed manner. The electrode 344 at a central portion (a phase adjusting region) changes the carrier density distribution therein to control the refractive index, and thus changes the phase of light propagated through the waveguide 341 to achieve the wavelength tuning in a wider range.

In general, the index n for TM mode is smaller than the index n for TE mode, and hence the tuned wavelength for TM mode is shifted toward a shorter wavelength side, relative to the tuned wavelength for TE mode. Therefore, if the tuned wavelength of a DFB filter is adjusted so that its gain is maximum, for example, for TE mode, the transmission intensity of the filter changes with time because the TE mode component varies when the polarization plane of signal light is rotated during transmission in the optical fiber. As a result, the received intensity varies with time, and a reduction of receiving sensitivity and an increase in error rate result. In the worst case, signal receiving is barely achieved if all the signal is coupled to the DFB filter in TM mode.

When FSK transmission, in which a high-density wavelength or frequency multiplicity is possible, is conducted, wavelength tracking for attaining stable reception is difficult since demultiplexing is conventionally performed by a single filter at the receiver side. The reason therefor is that there are mark and space frequencies respectively corresponding to "0" and "1" of a signal in the case of FSK transmission A separation or selection of a signal at the space frequency is difficult when the tuned wavelength of the filter is stabilized at the mark frequency, for example.

SUMMARY OF THE INVENTION

It is an object of the present invention to provide an optical semiconductor apparatus for solving the problem of polarization dependency in optical communications such as optical frequency multiplexing communication, and to provide an apparatus and a system using the optical semiconductor apparatus.

The object of the present invention is achieved by the following optical communication systems and apparatuses.

One aspect of the present invention provides an optical communication system that includes a light transmission line for transmitting signal light therethrough; and transmitter means for modulating two light signals having different wavelengths using a common modulation signal and for transmitting the modulated light signals to the light transmission line.

Another aspect of the present invention provides an optical communication system for communicating over a light transmission line that transmits signal light therethrough. The system includes transmitter means for modulating two light signals having different wavelengths using a common modulation signal and for transmitting the modulated light signals to the light transmission line, and receiver means is also included. The receiver means includes two photodetectors and the receiver means branches the light into two lights and directly detects the two branched lights using the two photodetectors.

Yet another aspect of the present invention provides an optical communication system for communicating over a light transmission line that transmits signal light therethrough. The system includes filtering means for demultiplexing the transmitted signal light, which is disposed on a receiver side; and transmitter means for modulating two light signals having different wavelengths using a common modulation signal and for transmitting the modulated light signals to the light transmission line.

Still another aspect of the present invention provides an integrated type optical semiconductor apparatus including two semiconductor lasers. The apparatus also has a semiconductor waveguide for multiplexing light signals generated by the lasers and an optical semiconductor modulator for modulating the multiplexed light signals. The modulator is monolithically integrated with the lasers and the waveguide.

A further aspect of the present invention provides an opto-electric conversion apparatus having transmitter means for modulating two light signals having different wavelengths using a common modulation signal and for transmitting the modulated light signals; and a semiconductor waveguide type filter. The filter has TE and TM mode transmission wavelengths tunable to coincide with the different wavelengths of the two signal lights.

According to another aspect of the invention, an optical frequency division multiplexing transmission system is provided which includes a light transmission line for transmitting signal light therethrough; and an opto-electric conversion apparatus connected to the light transmission line. The conversion apparatus includes transmitter means for modulating two light signals having different wavelengths using a common modulation signal and for transmitting the modulated light signals to the light transmission line, and a semiconductor waveguide type filter. The filter has means for tuning TE and TM mode transmission wavelengths thereof to respectively coincide with the different wavelengths of the two light signals.

According to yet another aspect of the invention, an optical cable television system for communicating over a light transmission line that transmits signal light therethrough is provided. The system has a receiver apparatus disposed on a subscriber side, which demultiplexes and detects the signal light using a filter; and a transmitter apparatus disposed at a broadcasting center. The transmitter modulates two light signals having different wavelengths using a common modulation signal and transmits the modulated light signals to the light transmission line. The filter has means for tuning TE and TM mode transmission wavelengths of the filter to respectively coincide with the different wavelengths of the two light signals.

According to yet another aspect of the invention, an optical communication system for communicating over a light transmission line that transmits signal light therethrough has transmitter means for modulating two light signals having different wavelengths using a common modulation signal and transmitting the modulated lights to the light transmission line; and a receiver apparatus. The receiver apparatus includes branching means for branching the modulated lights into two portions, two filters for respectively demultiplexing the branched two portions, and two photodetectors for respectively directly detecting demultiplexed lights from the filters.

Another aspect of the present invention provides an integrated type optical semiconductor apparatus including two semiconductor laser structures, which fuction as one of a laser and a filter in accordance with an amount of current injected thereinto. The apparatus further comprises a semiconductor waveguide for performing one of combining lights generated by the laser structures and branching light received by the apparatus into two portions which are respectively directed to the filters; and two photodetectors for detecting intensities of one of the lights generated by the laser structures functioning as lasers and the lights from the laser structures functioning as filters. The photodetectors are monolithically integrated with the laser structures and the waveguide.

Yet another aspect of the present invention provides an opto-electric conversion apparatus including transmitter means for modulating two light signals having different wavelengths using a common modulation signal and for transmitting the modulated light signals and branching means for branching light into two light portions. Also included are two semiconductor waveguide type filters, which have means for tuning TE and TM mode transmission wavelengths of the respective filters to respectively coincide with the different wavelengths of the two signal lights, and which have the same transmission wavelength difference between TE and TM mode transmission wavelengths and respectively receive the branched light portions and two photodetectors for respectively directly detecting lights transmitted through the two filters.

Still another aspect of the present invention provides an optical frequency division multiplexing transmission system having a light transmission line for transmitting signal light therethrough; and an opto-electric conversion apparatus connected to the light transmission line. The conversion apparatus includes transmitter means for modulating two light signals of different wavelengths using a common modulation signal and for transmitting the modulated light signals to the light transmission line, branching means for branching light into two light portions, and two semiconductor waveguide type filters. The filters have means for tuning TE and TM mode transmission wavelengths of the respective filter to respectively coincide with the different wavelengths of the two light signals, and have the same transmission wavelength difference between TE and TM mode transmission wavelengths and respectively receive the branched light portions. The system also has two photodetectors for respectively directly detecting lights transmitted through the two filters.

According to another aspect of the invention, an opto-electric conversion apparatus is provided which comprises two semiconductor laser structures, each of which fuctions as one of a laser and a filter in accordance with an amount of current injected thereinto. A semiconductor waveguide is provide for performing one of combining lights generated by the laser structures and branching light received by said apparatus into two portions which are respectively directed to the filters; and two photodetectors are provided for detecting intensities of one of the lights generated by the laser structures functioning as lasers and the lights from the laser structures functioning as filters. The photodetectors are monolithically integrated with the laser structures and the waveguide. The apparatus has means for controlling the amount of current injected into the laser structures so that the monolithically integrated laser structures, the waveguide and the photodetectors function as one of a transmitter and a receiver according to time division multiplexing.

Yet another aspect of the present invention provides an optical frequency division multiplexing transmission system including a light transmission line for transmitting signal light therethrough; and an opto-electric conversion apparatus connected to the light transmission line. The conversion apparatus includes two semiconductor laser structures, each of which fuctions as one of a laser and a filter in accordance with an amount of current injected thereinto; a semiconductor waveguide for performing one of combining lights generated by the laser structures and branching light received by said apparatus into two portions which are respectively directed to the filters; and two photodetectors for detecting intensities of one of the lights generated by the laser structures functioning as lasers and the lights from the laser structures functioning as filters. The photodetectors are monolithically integrated with the laser structures and the waveguide. The system also has means for controlling the amount of current injected into the laser structures so that the monolithically integrated laser structures, the waveguide and the photodetectors function as one of a transmitter and a receiver according to time division multiplexing.

According to still another aspect of the invention, an optical cable television system is provided which communicates over a light transmission line that transmits signal light therethrough. The system includes a receiver apparatus disposed on a subscriber side, which demultiplexes and detects the signal light using two filters; and a transmitter apparatus disposed at a broadcasting center, which modulates two light signals having different wavelengths using a common modulation signal and which transmits the modulated light signals to the light transmission line.

The principle of the present invention will be described with reference to FIGS. 2 and 3. A DFB filter 1 on a receiver side is assumed to be adjusted so that its tuned wavelength for TE mode filtering is 1553 nm and its tuned wavelength for TM mode filtering is 1552.3 nm, which is 0.7 nm shorter than 1553 nm. In this case, two lasers 2 and 3, which respectively generate light signals having wavelengths of 1553 nm and 1552.3 nm, are provided on a transmitter side. The light signals, which have the same intensity, are multiplexed, modulated by a common signal and coupled to an optical fiber 6.

When the light signals are transmitted through the optical fiber 6 and coupled to the DFB filter 1, the lights are caused to have the same polarization state as shown in FIG. 3. At this time, a TE mode component of 1553 nm (a component whose electric field is parallel with the layer plane of the device) and a TM mode component of 1552.3 nm are transmitted through the DFB filter 1 and detected by a photodetector 5. A TM mode component of 1553 nm and a TE mode component of 1552.3 nm cannot be transmitted. Thus, the received light is a sum of the TE mode component of 1553 nm and the TM mode component of 1552.3 nm. When the DFB filter 1 is designed so that gains for TE and TM modes are equal to each other, the light intensity of received lights does not vary largely even if their polarization planes are rotated. In principle, the light intensity varies only in a range of $1 \sim \sqrt{2}$. In FIG. 3, reference numeral 16 designates an active layer of the DFB filter 1.

In order that the two lights have the same polarization states 14 and 15 on the receiver side, those polarization states only have to be properly inclined with respect to each other when the light signals are combined on the transmitter side, considering the wavelength dispersion of polarization due to the optical fiber 6. The inclination angles of polarization states of the two lights on the receiver side are determined from the length of the optical fiber 6 and the wavelength difference between the two lights, so that those angles are uniquely decided when the light transmission line is constructed.

Further, in order to stably recieve an FSK signal, two DFB filters 101 and 102 are prepared as shown in FIG. 13. Since a wavelength difference between mark and space frequencies of the FSK signal is ordinarily approximately 0.2 Å, two DFB filters 101 and 102 may have the same structure. The tuned wavelengths of the DFB filters can be differentiated from each other by a slight difference between currents injected into the respective filters. One filter is adjusted to transmit only the mark frequency therethrough, while the other filter is adjusted to pass only the space frequency. The signal detection is conducted by utilizing a difference signal between two light outputs from the filters.

An example of a wavelength tracking method of a DFB filter will be briefly described. FIG. 17 illustrates locations of tuned wavelengths of the two DFB filters and the wavelengths of signal light. The static characteristic curve (low frequency component) of the difference output of the two DFB filters 101 and 102 is shown in FIG. 15. When the output (low frequency component of the difference output) of average frequency (wavelength) of mark and space frequencies is zero, the sensitivity is maximum. When such output is positive, the tuning of filters is deviated toward a shorter wavelength side. When negative, the tuning is deviated toward a longer wavelength side. Therefore, feedback control is performed so that the output is always zero. That is, part of the difference signal is input into a low pass filter, and a signal based on the output of the low pass filter is negatively fed back to the injection currents of the two DFB filters.

These advantages and others will be more readily understood in connection with the following detailed description of the preferred embodiments in conjunction With the drawings.

DESCRIPTION OF THE PREFERRED EMBODIMENTS

First Embodiment

A first embodiment of the present invention will be described with reference to FIG. 2.

Figure 1:
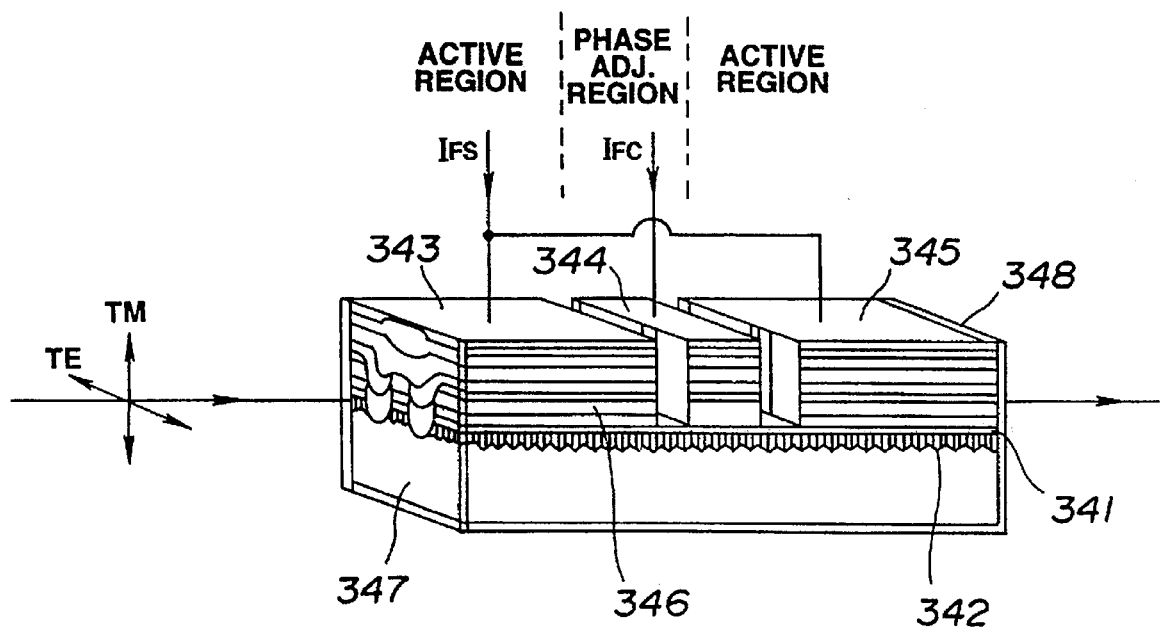
FIG. 1 is a view illustrating the polarization state of light which is coupled to a prior art DFB filter.
Figure 2:
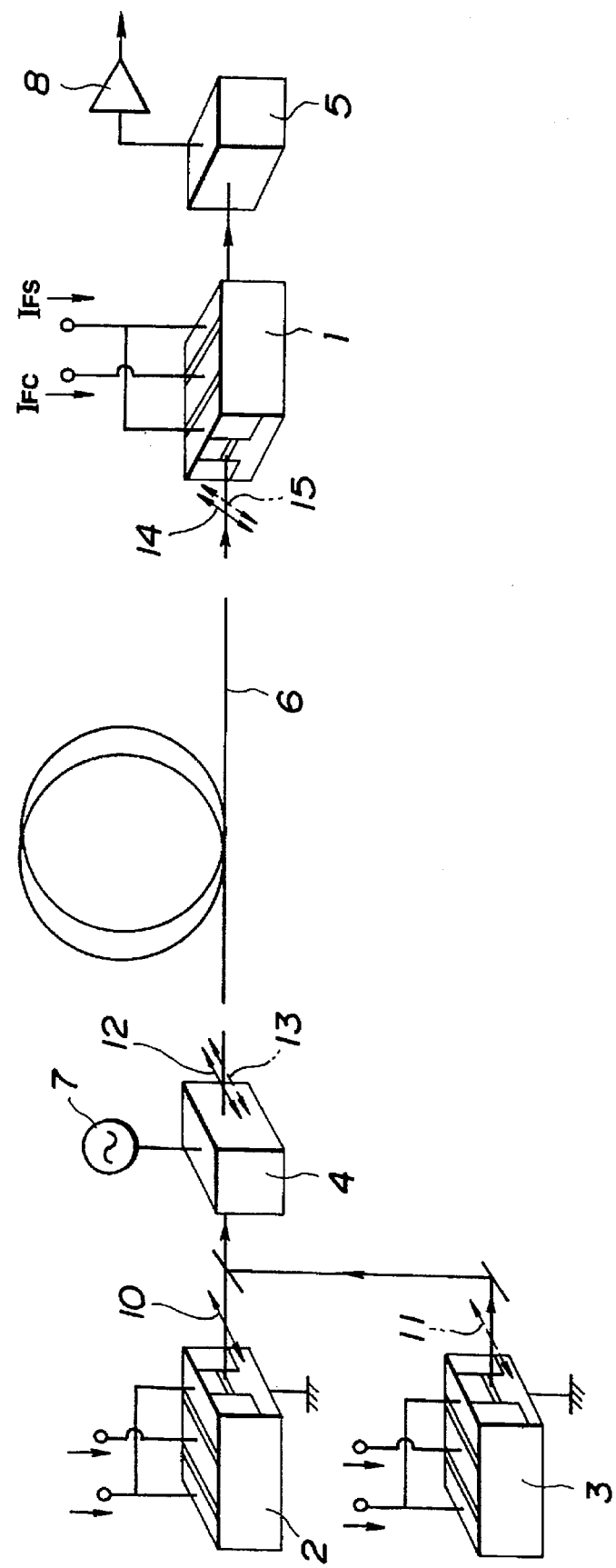
FIG. 2 is a view of a first embodiment of an optical communication system according to the present invention.
Figure 3:
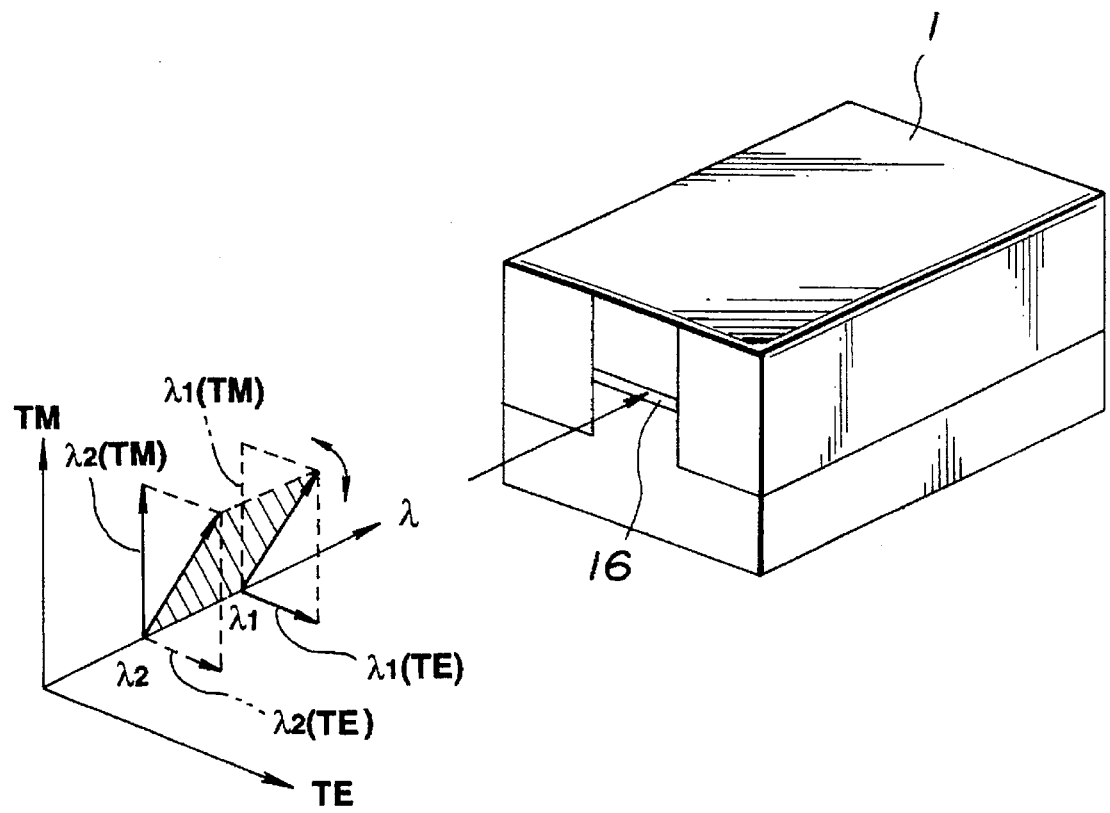
FIG. 3 is a view showing the polarization state of light which is coupled to a DFB filter in the first embodiment.
Figure 4:
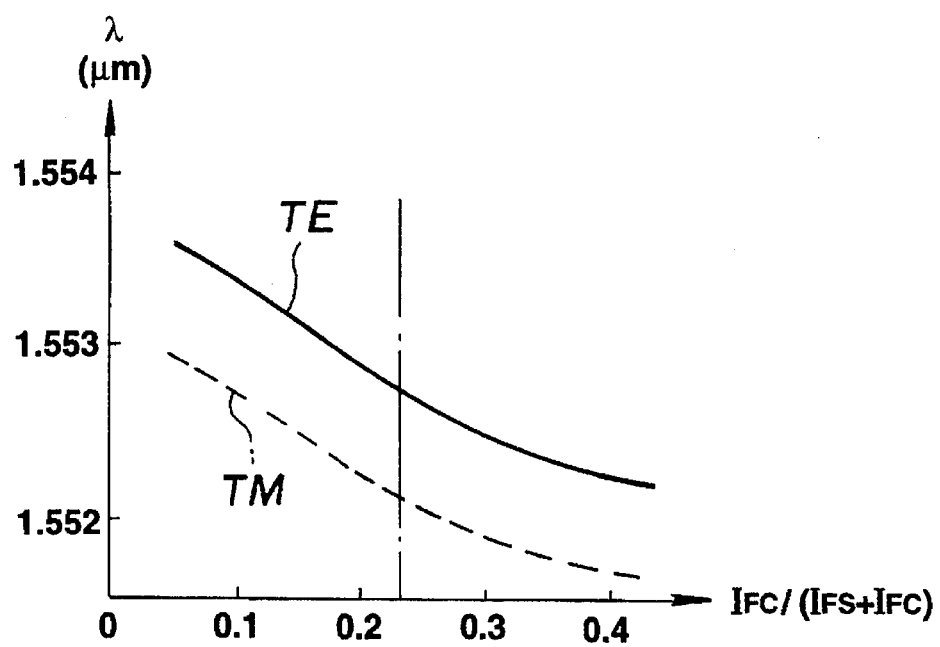
FIGS. 4A and 4B are graphs illustrating characteristics of the DFB filter in the first embodiment.
Figure 4:
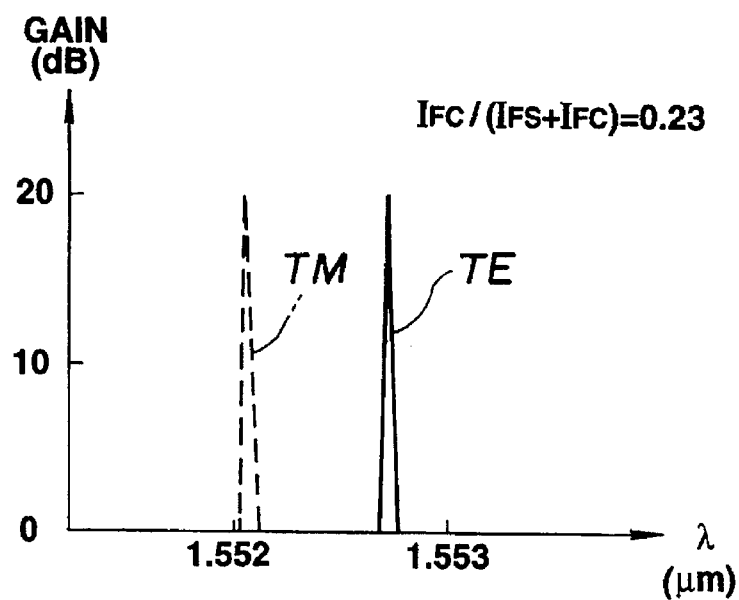

In FIG. 2, reference numeral 1 is a three-electrode tunable DFB filter. The same current $I_{FS}$ is injected into electrodes at opposite end portions of the DFB filter 1 while those electrodes are shortcircuited, and current $I_{FC}$ is injected into a central electrode independently from the current $I_{FS}$. The center transmission wavelength of the filter 1 is changed by controlling a ratio between currents $I_{FS}$ and $I_{FC}$ with an amplification factor and a transmission bandwidth being respectively maintained at constant values. The wavelength dependency of transmission characteristics is illustrated in FIGS. 4A and 4B. A diffraction grating of the DFB filter 1 has a first order (its pitch: 2400 Å), and a λ/4 shift region is formed at a central portion thereof. A waveguide of the filter 1 has a difference of approximately $1.46 \times 10^{-3}$ in its effective refractive index between TE and TM modes, and hence there is a difference of approximately 0.7 nm between Bragg conditions or tuned wavelengths of the two modes. Therefore, the tuned wavelength for TM mode, indicated by dotted lines in FIG. 4A, is 0.7 nm shorter than that for TE mode, indicated by a solid line in FIG. 4A.

The transmission characteristic of the filter at the time that the current ratio is 0.23 is shown in FIG. 4B. A strain superlattice active layer, for example, is formed so that the transmission gain amounts to, e.g., 20 dB, and no gain difference appears between TE and TM modes. Further, the filter's full-width at half maximum (FWHM) is set at 0.02 nm, and the transmission bandwidth between points at which the gain decreases by 10 dB is set at 0.03 nm. This characteristic is substantially constant when the tuned wavelength for TE mode is within a range of approximately 1 nm between 1.5525 μm and 1.5535 μm. In FIG. 2, reference numeral 5 is a photodetector and reference numeral 8 is an amplifier.

Further, reference numerals 2 and 3 are respectively three-electrode tunable DFB lasers, and their structures are substantially the same as the structure of the DFB filter 1. Those lasers 2 and 3 may be distributed Bragg reflection (DBR) type lasers.

The oscillation wavelength can be varied in a width of approximately 1.5 nm with a single mode being maintained, by changing the current ratio in a range between 0.1 and 0.6, similar to the DFB filter 1. Both of the two lasers 2 and 3 are oscillated in TE modes 10 and 11. When the laser 2 is adjusted to be oscillated at a wavelength of, e.g., 1.553 μm, the laser 3 is in turn adjusted to be oscillated at a wavelength of 1.5523 μm which is 0.7 nm shorter than 1.553 μm. Light of the laser 2 is directed to the TE mode tuning in the DFB filter 1, and light of the laser 3 is directed to the TM mode tuning in the DFB filter 1. When wavelength multiplexed signals are transmitted, the oscillated wavelengths of the lasers 2 and 3 are simultaneously changed, with the wavelength interval therebetween being maintained at approximately 0.7 nm.

Auto power control (APC) is performed in order to maintain light outputs of the two lasers 2 and 3 at constant values, and an optical isolator is arranged at each of their output ends to eliminate adverse influence of return light.

The two light signals in modes 10 and 11 are input into a modulator 4 after they are combined in the same polarization state, and the modulator 4 is driven by a modulation signal from a signal oscillator 7 to perform the optical intensity modulation. In this embodiment, a lithium niobate (LN) Max-Zehnder type modulator is used to reduce wavelength fluctuation or chirping during intensity modulation, but a modulator of semiconductor field absorption type or the like may be employed.

The modulated light signals in modes 12 and 13 are coupled to an optical fiber 6 and transmitted therethrough. A dispersion shift single mode fiber for a 1.55 μm band is used as the optical fiber 6. When the wavelength dispersion of polarization state in the fiber 6 is small and the polarization states of the two light signals are the same on the transmitter side, the polarization states 14 and 15 of the two light signals also are substantially the same when the light signals are coupled to the DFB filter 1 after transmission through the fiber 6. In contrast, the polarization planes of the two light signals are previously inclined relative to each other on the transmitter side so that they are the same after transmission through the fiber 6, when the transmission distance is long, e.g., more than several tens of km, or when the wavelength difference between the two light signals and hence the wavelength dispersion of the polarization state is serious.

In the case when light is transmitted in a 1.3 μm band or in a 0.8 μm band, an appropriate optical fiber is used therefor.

Figure 5:
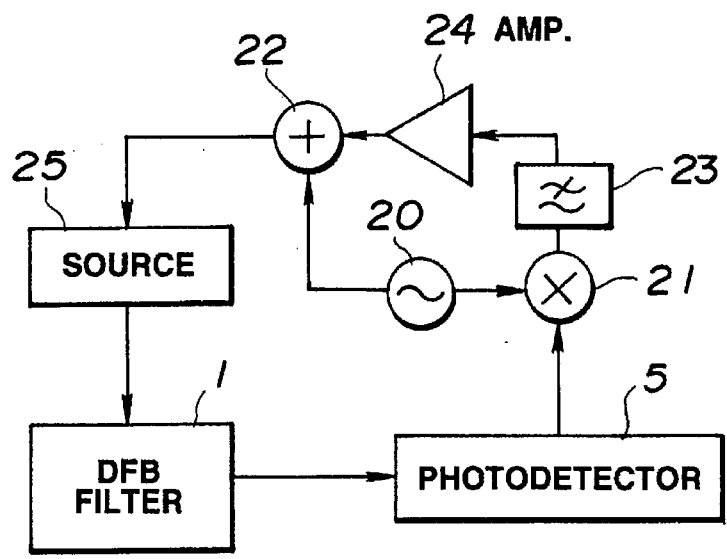
FIG. 5 is a block diagram showing a system for stabilizing a tuned wavelength of the DFB filter in the first embodiment.

When a signal is received by the DFB filter 1 and the photodetector 5, the transmission peak of the filter 1 has to be stably tuned to a desired wavelength, but it is difficult to control the transmission peak using only the temperature of the device. Therefore, the control and stabilization of the filter 1 is performed as shown in FIG. 5. The stabilization principle will be explained.

The DFB filter 1 is finely modulated by a low-frequency sinusoidal wave (10 kHz) from an oscillator 20, and an electric signal received by the photodetector 5 and the low-frequency sinusoidal wave are mixed in a multiplier device 21. Only a low-frequency component is extracted from an output signal of the multiplier device 21, by using a low pass filter 23 whose cutoff is set at 100 Hz, and the low-frequency component is amplified by an amplifier 24. An output of the amplifier 24 and the low-frequency sinusoidal wave from the oscillator 20 are added by an adder 22, and its result is negatively fed back to a DC component of a current source 25. Thereby, the transmission peak of the DFB filter 1 can be tuned to the wavelength of laser light in a range of the band between DC and 100 Hz.

When a signal is transmitted using such a method, an error rate hardly varies and is maintained at approximately $10^{-9}$ at the time when the receiving sensitivity is $-26$ dBm, even if the polarization plane of the signal is intentionally rotated by inserting a polarization control device into the optical fiber 6.

Figure 6:
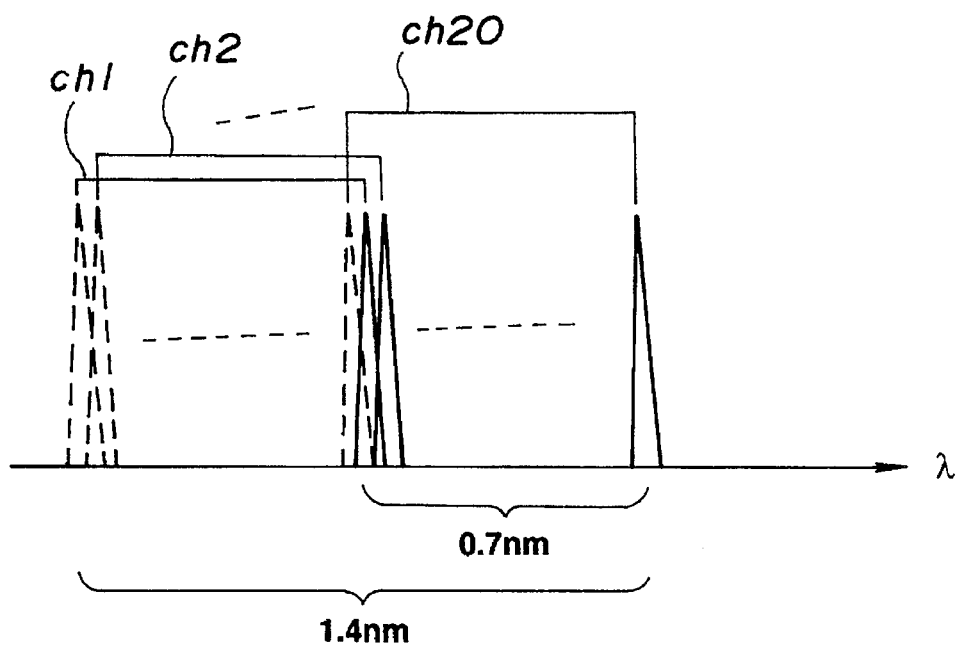
FIG. 6 is a view illustrating a method of optical frequency division multiplexing.

An optical frequency multiplexing method at the time of light transmission according to the above method will be described with reference to FIG. 6. The wavelength of light for TE mode filtering in a certain channel is indicated by solid lines and the wavelength for TM mode filtering is indicated by dotted lines. As shown in FIG. 6, respective channels consist of a pair of wavelengths which are 0.7 nm away from each other. Since the transmission band width at 10 dB down level of the DFB filter 1 is 0.03 nm as mentioned above, the multiplexing is conducted at wavelength intervals of approximately 0.035 nm in order to achieve the frequency multiplexing with crosstalk of 10 dB. Then, the limit comes at a position where wavelengths are arranged from Ch1 as shown in FIG. 6 and the wavelength for TM mode filtering in Chn arrives at a position 0.03 nm shorter than the wavelength for TE mode filtering in Ch1. In this case, the multiplexing transmission of 20 channels is possible since n=0.7/0.035=20.

The manner of arrangement of the wavelengths varies, depending on a difference between the tuned wavelengths for TE and TM mode filterings of the DFB filter 1 and the changeable width thereof. Thus, the wavelength multiplicity can be further increased.

Second Embodiment

Figure 7:
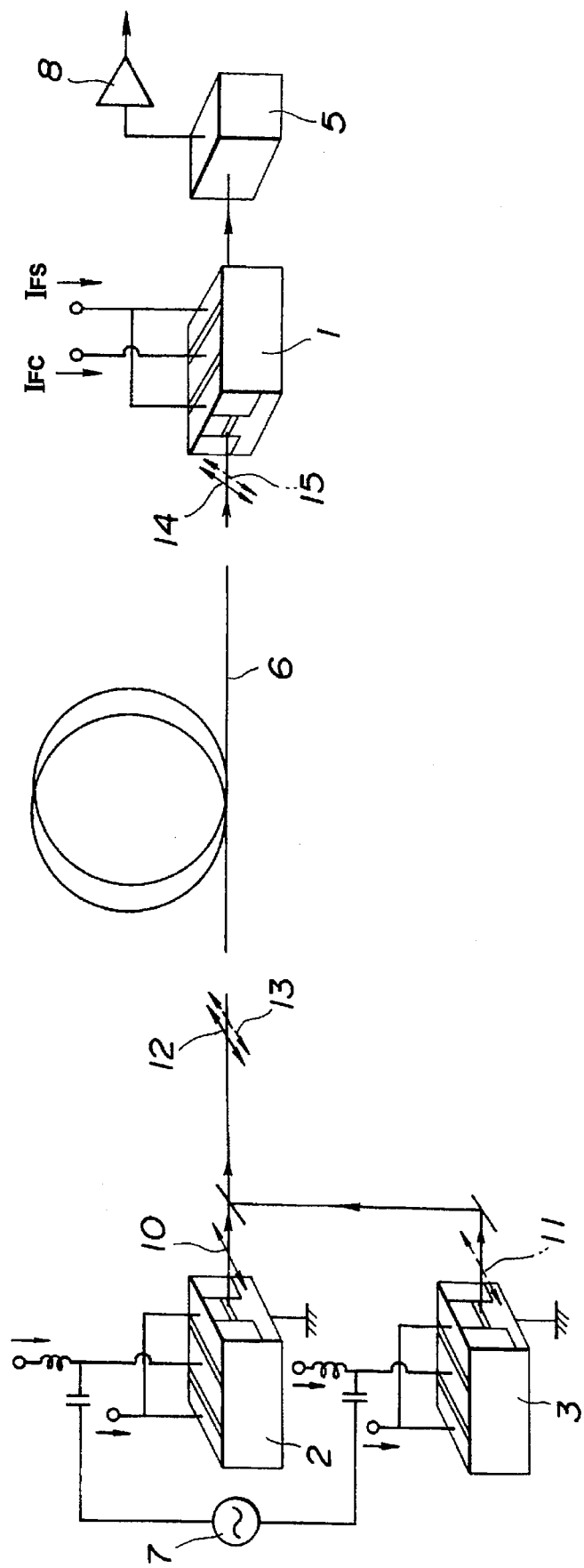
FIG. 7 is a view of second and third embodiments of an optical communication system according to the present invention.
Figure 8:
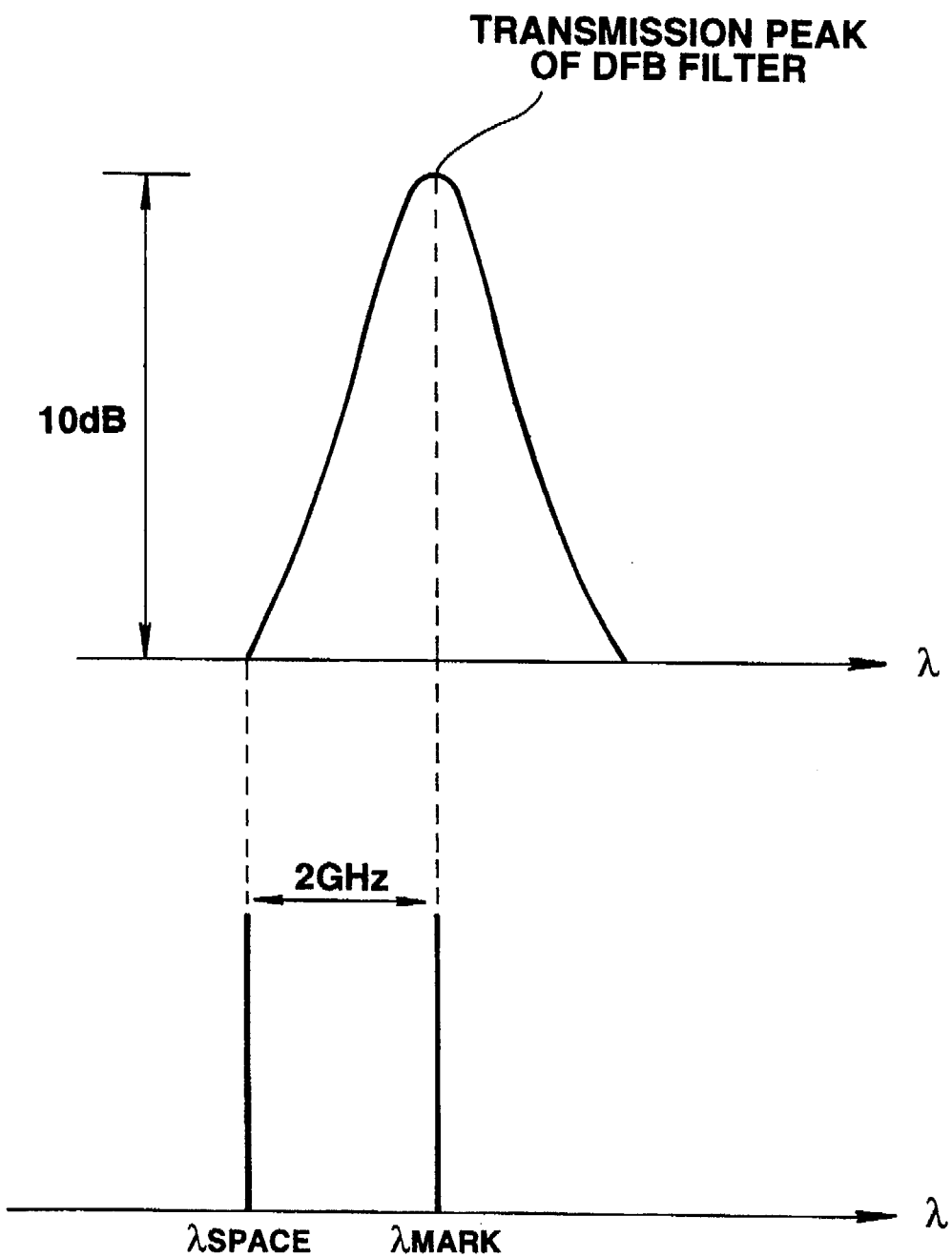
FIG. 8 is a view illustrating a method of tuning a DFB filter in the second embodiment.

A second embodiment will be described with reference to FIG. 7. In FIG. 7, portions or elements designated by the same reference numerals as those in FIG. 2 are portions or elements having the same functions or meanings. Although the modulation system of the first embodiment is an intensity modulation system which uses an external modulator, lasers 2 and 3 are directly frequency-modulated in the second embodiment. In order to achieve the direct frequency-modulation, a common modulation signal from an oscillator 7 need only be overlapped on bias currents applied to the central electrodes of the lasers 2 and 3. In order to achieve a code transmission, the FSK modulation method can be utilized.

The maximum frequency deviation of FSK modulation (i.e., a difference between a space frequency corresponding to "0" and a mark frequency corresponding to "1") is set at a half of a 10 dB bandwidth of the DFB filter 1. Namely, this value is set at 0.015 m (=2 GHz). Therefore, side-modes appear at both sides ±0.075 nm away from each of the oscillation wavelengths for TE and TM mode filterings, but crosstalk would not occur since those oscillation wavelengths are 0.7 nm away from each other.

In the second embodiment, the manner of setting a position of a transmission peak of the DFB filter 1 is different from that of the first embodiment. As shown in FIG.

8, the transmission peak is set to coincide with the mark frequency $\lambda_{mark}$ and the space frequency $\lambda_{space}$ is set at a place where the transmission gain is lowered 10 dB. In this case, the multiplicity of wavelengths is reduced, compared to the first embodiment, since the occupation region of a wavelength in one channel is widened. There is, however, the advantage that no external modulator is needed.

Third Embodiment

In a third embodiment of the present invention, the modulation is implemented by using a direct intensity modulation of the lasers 2 and 3. The transmission system is the same as that shown in FIG. 7.

When the direct intensity modulation is conducted, chirping of wavelengths occurs and hence the occupation bandwidth of one channel is broadened. Thus, the multiplicity of wavelengths is largely decreased. The occupation bandwidth is approximately equal to 3 Å. Accordingly, the transmission bandwidth of the DFB filter 1 is widened and set at approximately several Å.

In the third embodiment, the following advantages can be obtained. No external modulator is needed and the stabilization of wavelengths is unnecessary on both the transmitter and the receiver sides.

Fourth Embodiment

Figure 9:
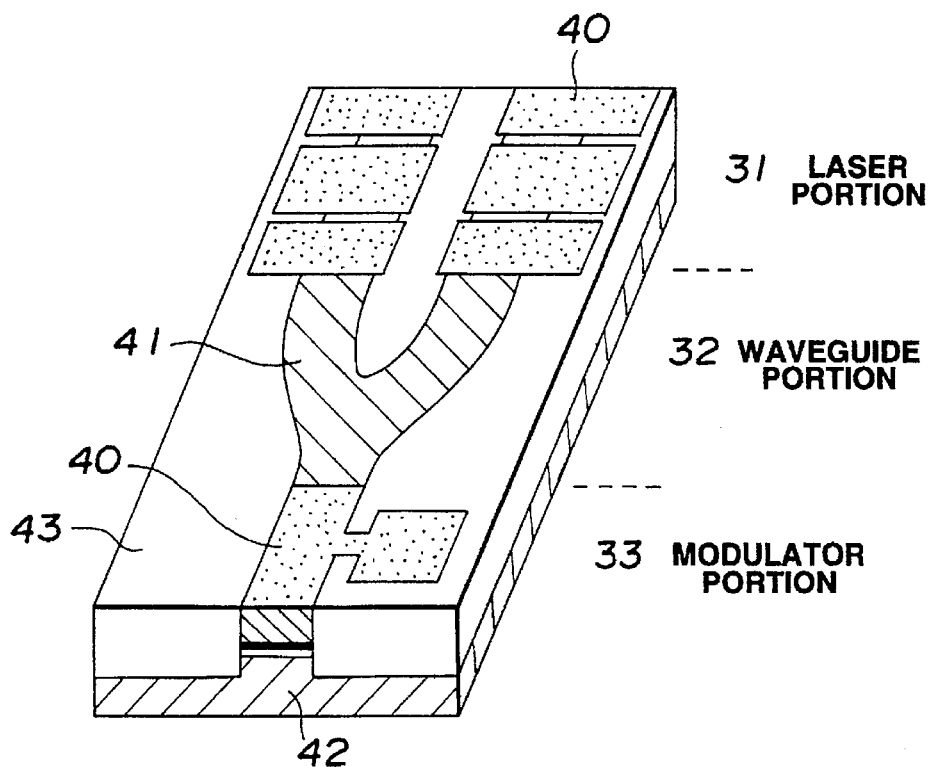
FIG. 9 is a view of a fourth embodiment of the present invention, showing integrated type optical transmitter.

A fourth embodiment of the present invention, which is an integrated optical transmitter, will be described with reference to FIG. 9. In this embodiment, two tunable lasers and a field absorption type modulator are integrated to perform the optical communication described in the first embodiment.

Figure 10:
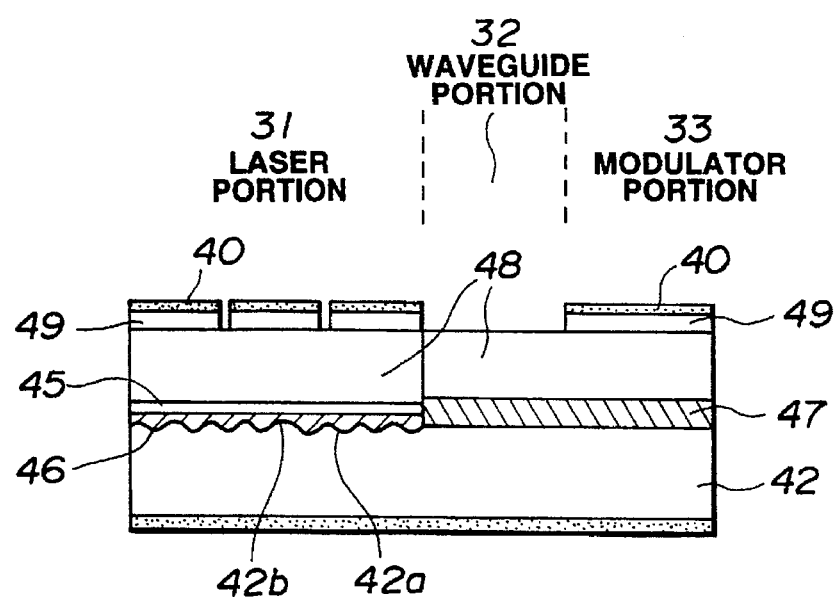
FIG. 10 is a cross-sectional view of the integrated type DFB optical transmitter shown in FIG. 9.

The structure of layers is shown in FIG. 10. In FIG. 10, a laser portion 31 includes an InGaAsP light guide layer 46 of 1.3 μm composition formed on an InP substrate 42, an InGaAs/InGaAsP strain multiple quantum well (MQW) active layer 45, an InP cladding layer 48 and an InGaAsP contact layer 49. A modulator portion 33 and a waveguide portion 32 respectively include an InGaAsP light guide layer 47 of 1.4 μm composition formed on an InP substrate 42, an InP cladding layer 48 and an InGaAsP contact layer 49. The laser portion 31 is coupled to the waveguide portion 32 in a butt-joint manner. In the laser portion 31, a λ/4 shift first-order diffraction grating 42a is formed on the InP substrate 42, and a three-electrode (40) structure, in which a λ/4 shift region 42b is centrally located, is constructed. In the modulator portion 33, one waveguide 41 is formed (see FIG. 9), and an electric field is applied thereto through the electrode 40. The waveguide 41 has the burying structure which uses InP 43 (see FIG. 9).

The above structure is fabricated in the following manner. The λ/4 shift diffraction grating 42a is formed at a desired position of the InP substrate 42, and the light guide layer 46, active layer 45, cladding layer 48 and contact layer 49 are grown by a metal organic-chemical vapor deposition (MOCVD) method. A portion is etched down to the substrate 42, and the light guide layer 47, cladding layer 48 and contact layer 49 are regrown by using the MOCVD method again. Then, as shown in FIG. 9, the waveguide 41 of a Y-branch structure is patterned and etching is conducted. Thereafter, the high-resistance InP 43 is buried and regrown. Then, the electrodes 40 with a pattern as shown in FIG. 9 are formed.

It is desirable that the two lasers are respectively designed so that oscillation wavelengths of the two lasers can differ from each other by 0.7 nm when equal currents are uniformly injected into their three electrodes 40. For example, such a design is achieved by controlling a pitch of the diffraction grating 42a or a mesa-width of the waveguide 41.

In this embodiment, since the devices are integrated, two light signals, which are oscillated by driving the two lasers by a common signal, are naturally coupled to the transmission line in the same polarization state. Therefore, if a difference between the two polarization states of the two laser light signals occurs on the receiver side, a polarization control device needs to be inserted according to the circumstances.

Fifth Embodiment

Figure 11:
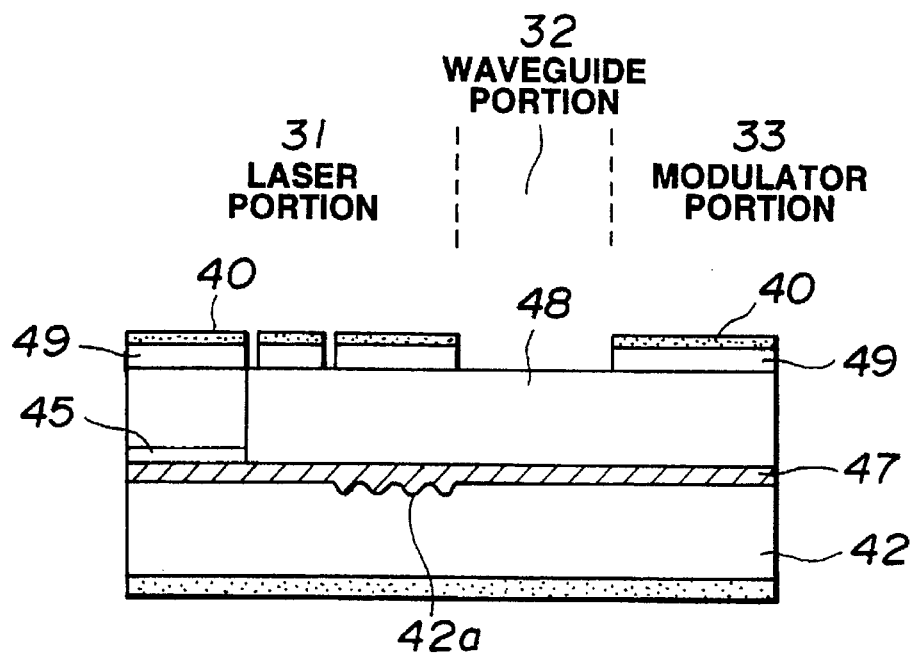
FIG. 11 is a cross-sectional view of a fifth embodiment of the present invention, showing an integrated type DBR optical transmitter.

A fifth embodiment will be described with reference to FIG. 11. The fifth embodiment is directed to an integrated light source for implementing the optical communication of the first embodiment, similar to the fourth embodiment. In FIG. 11, portions or elements designated by the same reference numerals as FIG. 10 are portions or elements having the same functions. Each of the lasers is a three-electrode distributed Bragg reflection (DBR) type, and its wavelength changeable range is widened to 3 nm which is twice the value (1.5 nm) noted above.

The layer structure is substantially the same as that of the fourth embodiment. The device is fabricated in the following manner. After a diffraction grating 42a is formed at a desired location of an InP substrate 42, light guide layer 47, active layer 45, cladding layer 48 and contact layer 49 are grown. After a portion is etched down to the active layer 45, a cladding layer 48 is regrown on the exposed light guide layer 47. Thereafter, a burying process and an electrode-formation process are performed.

In the fourth and fifth embodiments, devices on the transmitter side are integrated. Also on the receiver side, the DFB filter 1 and photodetector 5 may be integrated.

In the foregoing, 1.55 μm band devices are used, but 1.3 μm band devices or 0.8 μm band devices (GaAs/AlGaAs series) may be used.

Sixth Embodiment

Figure 12:
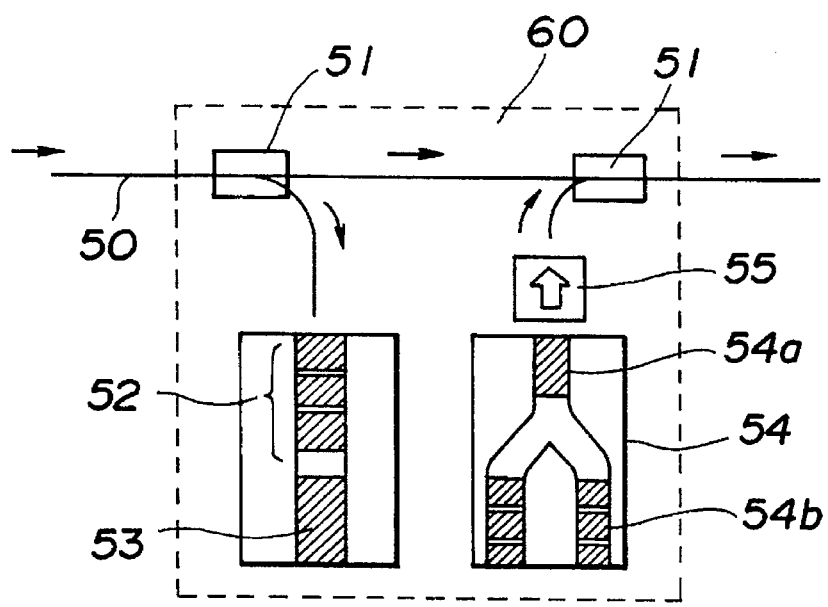
FIG. 12 is a view of a sixth embodiment, showing an optical node which uses an apparatus of the present invention.
Figure 24:
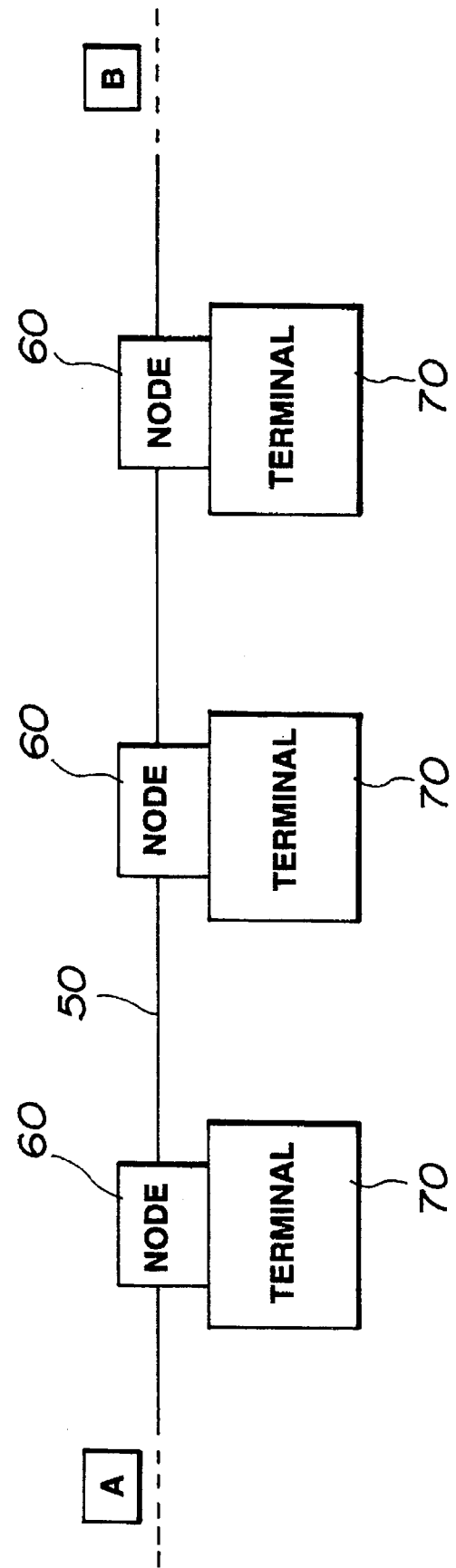
FIG. 24 is a view of an optical local area network (LAN) according to the present invention.

A sixth embodiment will be described with reference to FIG. 12. The sixth embodiment is directed to an opto-electric converting unit (node), which is connected to a terminal when the apparatus and optical communication system of the present invention are applied to an optical local area network (LAN) system. FIG. 24 shows an optical LAN system which uses the node.

A light signal is taken into the node 60 through an optical fiber 50, and a portion of the signal is input into a tunable filter 52 by a branching device 51. Only a light signal at a desired wavelength is transmitted and amplified by the tunable filter 52, and the signal is directly detected by an optical receiver 53 integrated with the filter 52 to be converted to an electric signal.

On the other hand, when a light signal is transmitted from the node 60, light from an integrated optical transmitter 54 of the fourth or fifth embodiment is modulated by an integrated optical modulator 54a. The modulated light is input into the light transmission line 50 through an isolator 55 and a branching device 51. A plurality of tunable filters 52 and a plurality of pairs of tunable lasers 54b may be provided to widen the wavelength changeable range.

The network of an optical LAN system shown in FIG. 24 is a bus type. Additional nodes 60 may be connected along directions A and B, and a number of terminals 70 and centers may be arranged. However, in order to connect a large number of nodes 60, it is necessary to serially dispose optical amplifiers for compensating for attenuation of light in the transmission line 50. Further, two nodes 60 may be connected to each terminal 70 and two transmission lines 50 may be provided to accomplish a bi-directional transmission of DQDB system.

In such an optical network system, when the apparatus of the present invention is utilized, the wavelength division multiplexing optical transmission network, in which the wavelength multiplicity is 20 and no polarization dependency occurs as described in the first embodiment; can be constructed.

As a network, a loop type, which is constructed by connecting A and B in FIG. 24, a star type or a compound configuration thereof may be used.

Seventh Embodiment

A seventh embodiment will be described with reference to FIG. 13. The seventh embodiment is directed to a structure for stably receiving an FSK signal.

Figure 13:
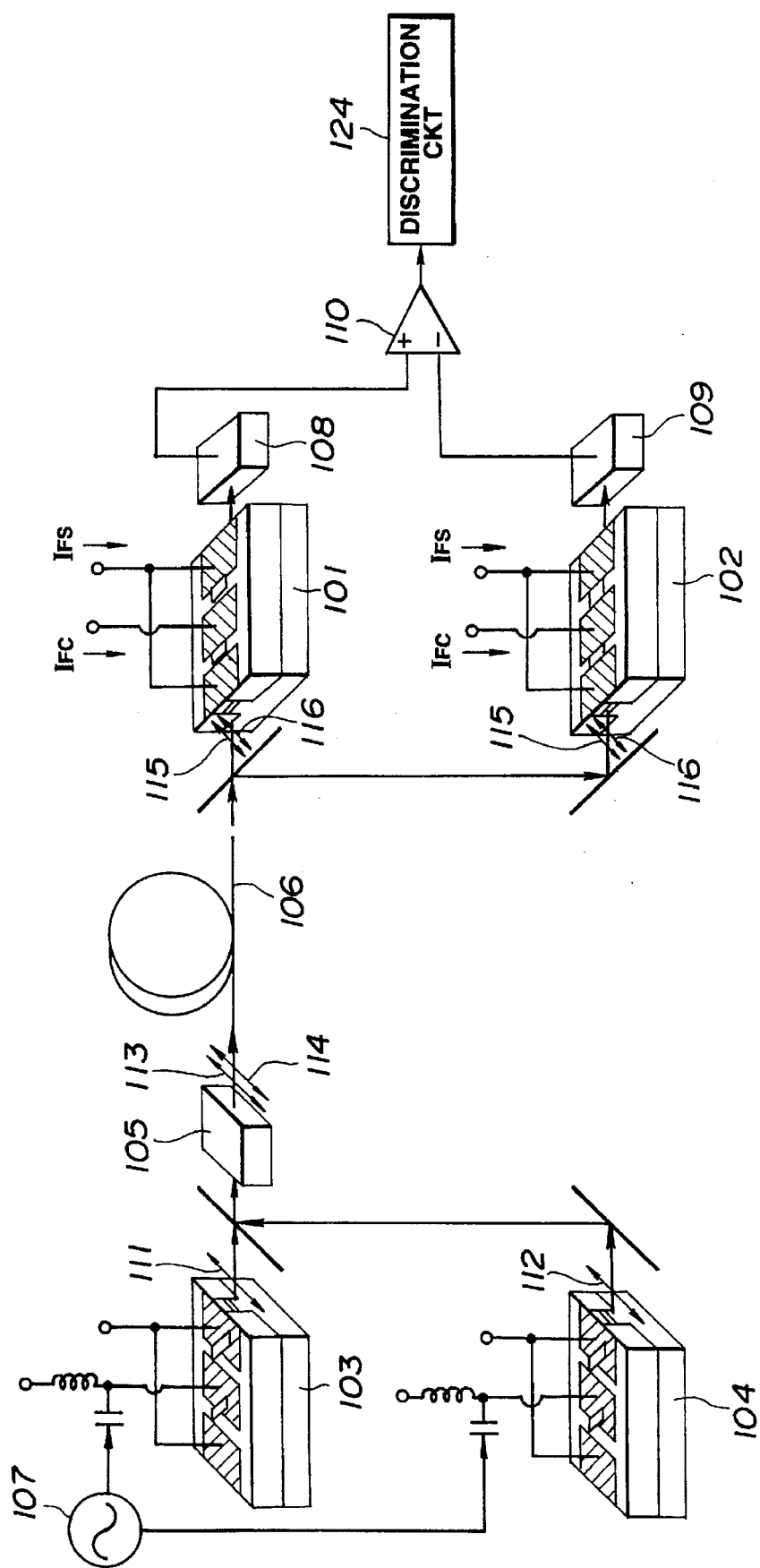
FIG. 13 is a view of a seventh embodiment, showing an optical communication system according to the present invention.

In FIG. 13, reference numerals 101 and 102 respectively designate three-electrode tunable DFB filters. The currents injected into the DFB filters 101 and 102 are current $I_{FS}$ injected into opposite end electrodes while the end electrodes are shortcircuited, and current $I_{FS}$, injected into a central electrode independently from the current $I_{FS}$. Its transmission or tuned wavelength can be changed while an amplification factor and a transmission bandwidth are maintained at constant values, by controlling the ratio between currents $I_{FS}$ and $I_{FC}$. The wavelength dependency of the transmission characteristic and the like is the same as those described in the first embodiment explained with reference to FIG. 4.

Tuned wavelengths of the two DFB filters 101 and 102 are slightly deviated from each other. One is tuned to a mark frequency or wavelength of an FSK signal and the other is tuned to a space frequency or wavelength of the FSK signal. A difference between mark and space wavelengths is set at 0.02 nm which is approximately equal to a half width of the DFB filters 101 and 102. Therefore, the tuned wavelengths are varied with the wavelength interval between center transmission wavelengths of the two DFB filters 101 and 102 being maintained at 0.02 nm.

In FIG. 13, reference numerals 103 and 104 respectively designate three-electrode tunable lasers, whose structures are substantially the same as that of the DFB filter mentioned above. Each of the lasers 103 and 104 may be a DBR type.

The oscillation wavelength can be changed within a range of approximately 2.0 nm with its single mode being maintained, by changing the current ratio from 0.1 to 0.6, similar to the DFB filters 101 and 102. Two lasers 103 and 104 are both oscillated in TE modes 111 and 112. When the laser 103 is adjusted to radiate light, for example, at a wavelength of 1.553 µm, the laser 104 is in turn adjusted to radiate light at a wavelength of 1.5523 µm, that is, 0.7 nm shorter than 1.553 µm. The light from the laser 103 serves for TE mode filtering or tuning of the DFB filters 101 and 102, while the light from the laser 104 serves for TM mode filtering thereof. When wavelength division multiplexed signals are transmitted, the wavelengths of the lasers 103 and 104 are simultaneously changed while the wavelength interval therebetween is fixed to approximately 0.7 nm.

APC control is effected in order to maintain outputs of the lasers 103 and 104 at constant values. FSK modulation is conducted by superimposing a modulation signal from an oscillator 107 on bias currents applied to the central electrodes of the lasers 103 and 104. Frequency modulation efficiency (an amount of frequency change/an amount of current change) of the laser is approximately constant at 800 MHz/mA in a range between DC and 3 GHz. As discussed above, the frequency deviation of an FSK signal is set at 0.02 nm (≈3 GHz). Therefore, the two lasers 103 and 104 need only be modulated by a minute current amplitude of approximately 4 mA.

The two modulated light signals are combined in the same polarization states 111 and 112, and are passed through an optical isolator 105 for eliminating influences of return light. Thereafter, the light signals are coupled to an optical fiber 106 in polarization states 113 and 114 and are transmitted therethrough. A dispersion shift single mode fiber for 1.55 µm band is employed as the optical fiber 106. When the wavelength dispersion of polarization in the fiber 106 is small and the coupled light signals have the same polarization states 113 and 114 on the transmitter side, the two light signals have substantially the same polarization states 115 and 116 when they are transmitted and coupled to the DFB filters 101 and 102. If the transmission distance is long, for example, longer than several tens of kilometers, or a difference between wavelengths of the two light signals is relatively large and the wavelength dispersion of polarization is not negligible, then polarization planes of the two light signals are adjusted on the transmitter side so that they have the same polarization state on the transmitter side. When light in the 1.3 µm band or the 0.8 µm band is transmitted, an appropriate optical fiber therefor is used.

When a signal is received by DFB filters and photodetectors, outputs from the respective photodetectors 108 and 109 are input into a differential amplifier 110 and its output is input into a discrimination circuit 124 to be detected. In this case, since the differential amplifier 110 is used, in-phase noises are offset or eliminated and the sensitivity is improved, compared with the case where a signal is detected using a single detector.

Figure 14:
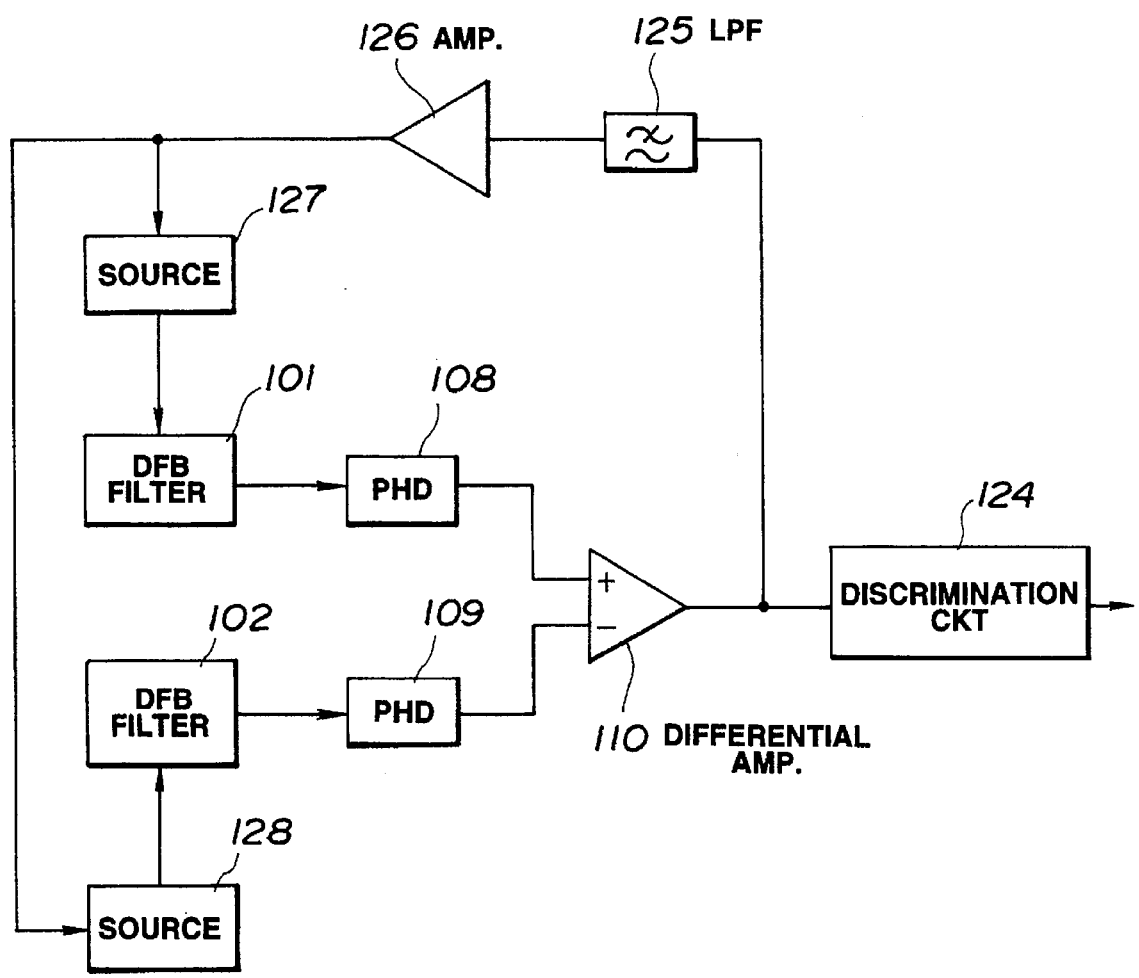
FIG. 14 is a block diagram showing a system for stabilizing a tuned wavelength of the DFB filter in the seventh embodiment.

Transmission peaks of the filters 101 and 102 need to be stably accorded to desired wavelengths, but it is difficult to control the filters 101 and 102 only by using a temperature of the device. Therefore, the control is achieved by means as shown in FIG. 14. The principle will be described.

Figure 15:
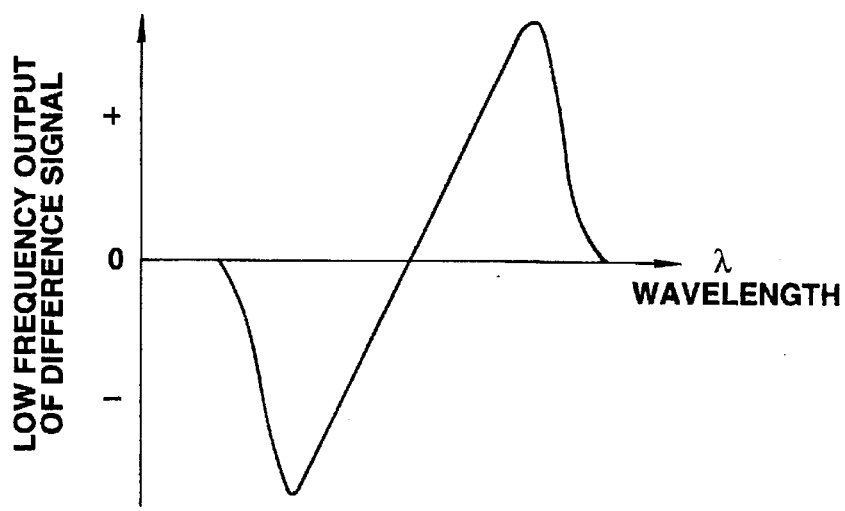
FIG. 15 is a view illustrating a low frequency output of a difference signal between two DFB filters in the seventh embodiment.

An interval between tuned wavelengths of the DFB filters 101 and 102 is stabilized at the interval between the mark and space wavelengths of an FSK signal by using temperature and bias current. If wavelengths of input light and the filters 101 and 102 are deviated from each other for some reason, a low frequency component of a difference signal of light signal outputs from the filters 101 and 102 will shift toward a positive or negative direction. Since an ordinary modulated signal consists of 50% mark component and 50% space component, the low frequency component of the difference signal is sure to be zero when the filters 101 and 102 are correctly tuned. FIG. 15 shows such a situation.

Accordingly, the direction of wavelength shift is detected by a low pass filter 125, using the low frequency component of the difference signal, in the stabilization system as shown in FIG. 14. If the low frequency component is positive, the ratio $I_{FC}/(I_{FC}+I_{FS})$ of bias currents is reduced so that the tuned wavelengths of the DFB filters 101 and 102 are moved toward a longer wavelength side (see characteristic of tuned wavelength of filters illustrated in FIG. 4A). If negative, an opposite operation is performed. Thus, the negative feedback is implemented. In FIG. 14, reference numeral 126 designates an amplifier and reference numerals 127 and 128 respectively designate current sources of the filters 101 and 102.

When the transmission is performed in such a manner and an FSK signal is detected by the difference signal obtained by the differential amplifier 110, an error rate is approximately $10^{-9}$ at the receiving sensitivity of −26 dBm and hardly varies even if the polarization plane of the signal is intentionally rotated by inserting a polarization control device in the optical fiber 106.

Figure 16:
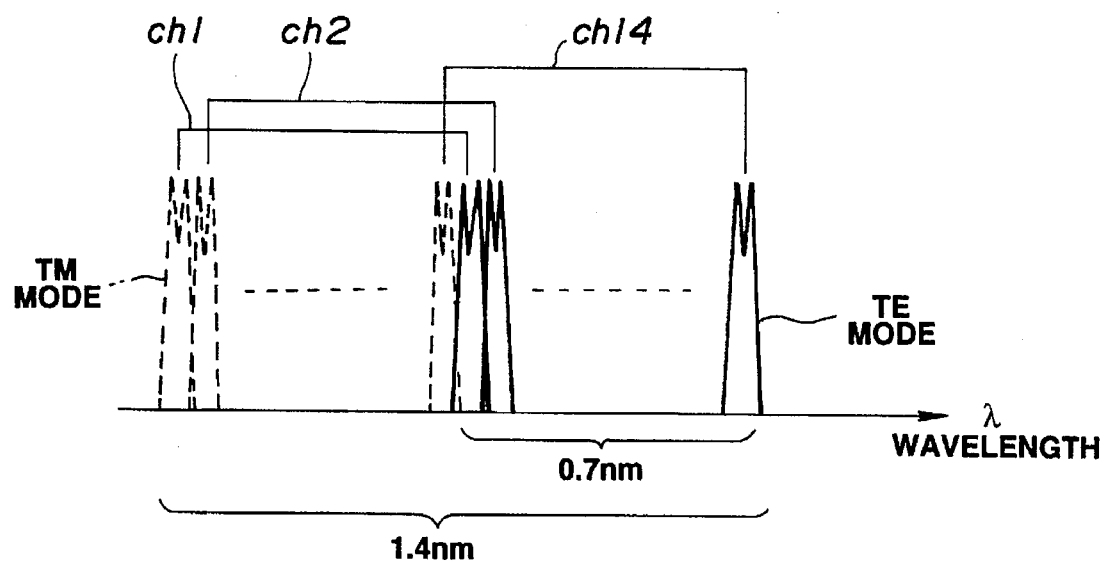
FIG. 16 is a view illustrating a method of optical frequency division multiplexing.
Figure 17:
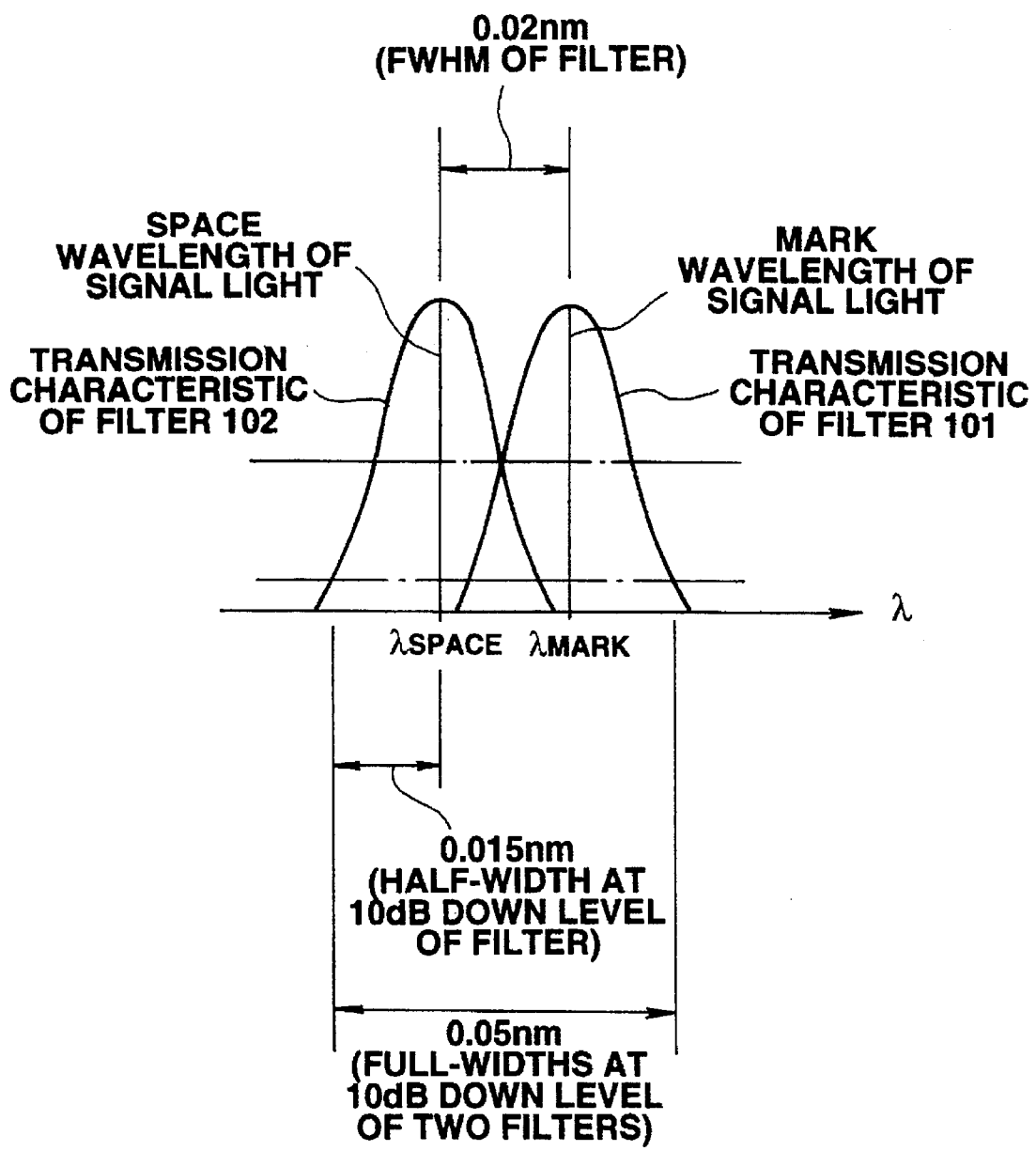
FIG. 17 is a view illustrating transmission wavelength bandwidths occupied by the two DFB filters in the seventh embodiment.

An optical frequency multiplexing method at the time of light transmission according to the above method will be described with reference to FIG. 16. The wavelength of light for TE mode filtering in a certain channel is indicated by solid lines and the wavelength for TM mode filtering is indicated by dotted lines. As shown in FIG. 16, respective channels Ch1–Ch14 consist of a pair of wavelengths which are separated from each other by 0.7 nm. Since the 10 dB down level transmission bandwidth of the DFB filter is 0.03 nm, as mentioned above, and since two DFB filters 101 and 102, whose center transmission wavelengths are separated from each other by 0.02 nm, demultiplex the multiplexed signals to receive one channel, the multiplexing is conducted with the wavelength interval of approximately 0.05 nm in order to achieve the frequency multiplexing with crosstalk of 10 dB, as shown in FIG. 17. In this case, a limit comes at a position where wavelengths are arranged from Ch1 as shown in FIG. 16 and the wavelength for TM mode filtering of Chn arrives at a position 0.05 nm shorter than the wavelength for TE mode filtering of Ch1. In this case, the multiplexing transmission of 14 channels is possible because of n=0.7/0.05=14. A manner of arrangement of wavelengths varies depending on a difference in tuned wavelength between TE and TM mode filterings of the DFB filter and the changeable width thereof, and thus the multiplicity of wavelengths can be further increased.

Eighth Embodiment

Figure 18:
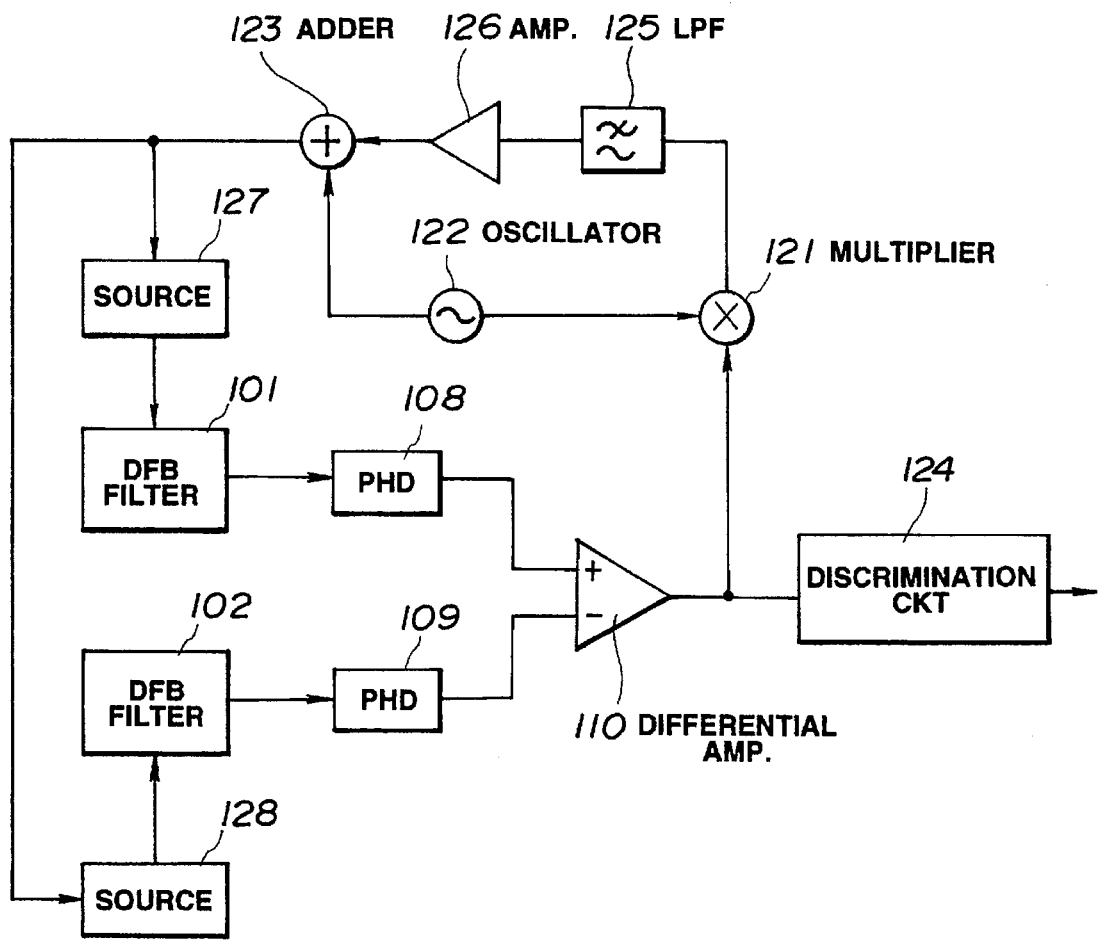
FIG. 18 is a block diagram showing a system for stabilizing a tuned wavelength of a DFB filter in an eighth embodiment of the present invention.

FIG. 18 shows an eighth embodiment which is directed to an apparatus for stabilizing the tuned wavelength. In the seventh embodiment, the wavelength tracking of the DFB filters 101 and 102 is performed by taking out the low frequency component of the difference signal. In contrast, the wavelength tracking is conducted by a wobbling method in this embodiment.

In each of two DFB filters 101 and 102, an in-phase low frequency sinusoidal signal from an oscillator 122 is superimposed on bias currents applied to central and opposite end electrodes and the selection wavelengths of the filters 101 and 102 are slightly modulated with the same phase. The low frequency component (its frequency is smaller than the modulation frequency of the oscillator 122) of the difference signal, which is mixed with the low frequency sinusoidal signal from the oscillator 122 by the multiplier 121, is extracted by the low pass filter 125. The output from the low pass filter 125 is added to the signal, which modulates the filters 101 and 102, by an adder 123.

Figure 19A:
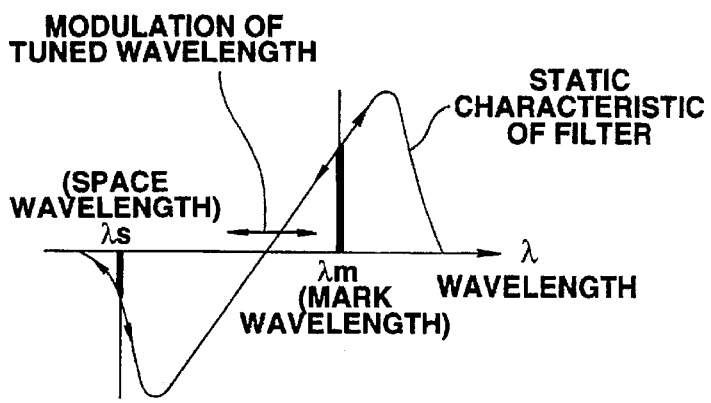
FIGS. 19A, 19B and 19C are views illustrating a method of stabilizing a tuned wavelength of the DFB filter in the eighth embodiment of the present invention.
Figure 19B:
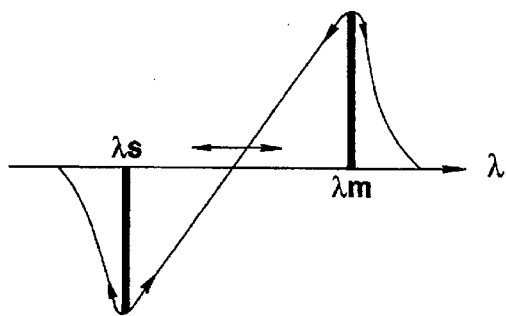
Figure 19C:
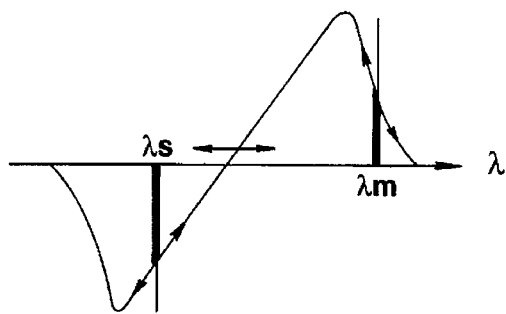

FIG. 19 illustrates the relation between the transmission characteristic represented by the difference signal after transmission through the filters 101 and 102, the input light, and the output signal. When the wavelengths of input lights are positioned on a shorter wavelength side relative to the tuned wavelengths of the filters 101 and 102 as shown in FIG. 19A, an output, whose phase is the same as the phase of the modulation signal injected into the central electrodes of filters 101 and 102, is obtained in such a manner that the output signal decreases if the tuned wavelengths of the filters 101 and 102 shift to a longer wavelength side and increases if those tuned signals shift to a shorter wavelength side. Conversely, when the tuned wavelengths of the filters are positioned on a longer wavelength side as shown in FIG. 19C, an output, whose phase is opposite to the phase of the modulation signal, is obtained. When the tuned wavelengths of the filters 101 and 102 coincide with mark and space wavelengths of the input light as shown in FIG. 19B, an output of a double frequency can be obtained since the phase of the output is altered between in-phase and opposite phases around the peak. The mixed output of such a signal from the low pass filter 125 is a DC signal which is positive at the time of in-phase phases, negative at the time of opposite phases and zero at the time of double frequency. Accordingly, the negative feedback operation is conducted for the bias currents of the filters 101 and 102. In this embodiment, the modulation signal used for the wobbling operation is a sinusoidal wave whose amplitude and frequency are respectively 1 mA and 10 kHz.

Ninth Embodiment

Figure 20:
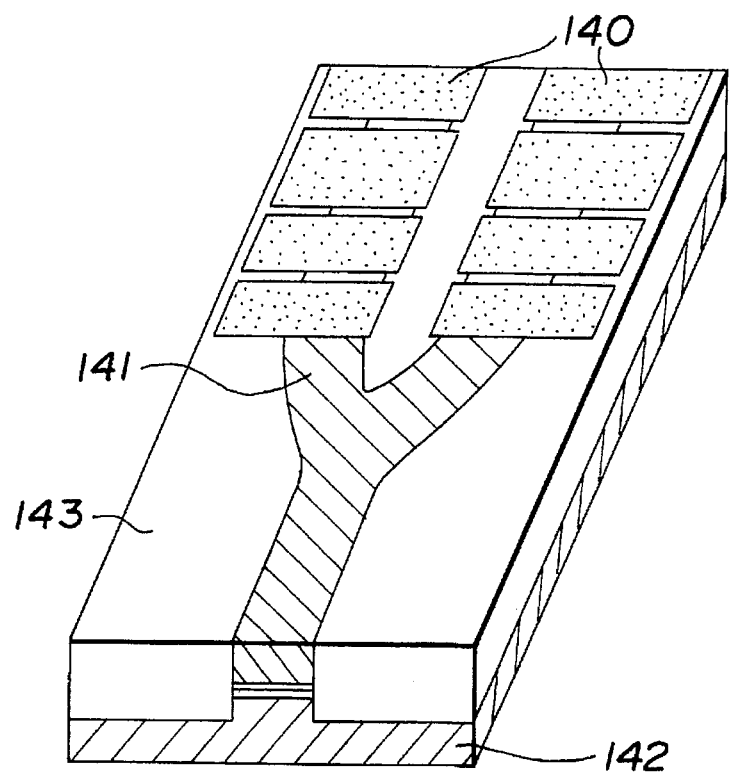
FIG. 20 is a view of a ninth embodiment of the present invention, showing an integrated type optical transmitter.

A ninth embodiment of the present invention, which is an integrated optical transmitter or receiver, will be described with reference to FIG. 20. In this embodiment, two tunable lasers or tunable filters, a light branching device and two photodetectors are integrated to perform the optical communication described in the seventh embodiment. Structures of the lasers and the filters may be completely the same, and they can be alternately chosen according to the driving method.

Figure 21:
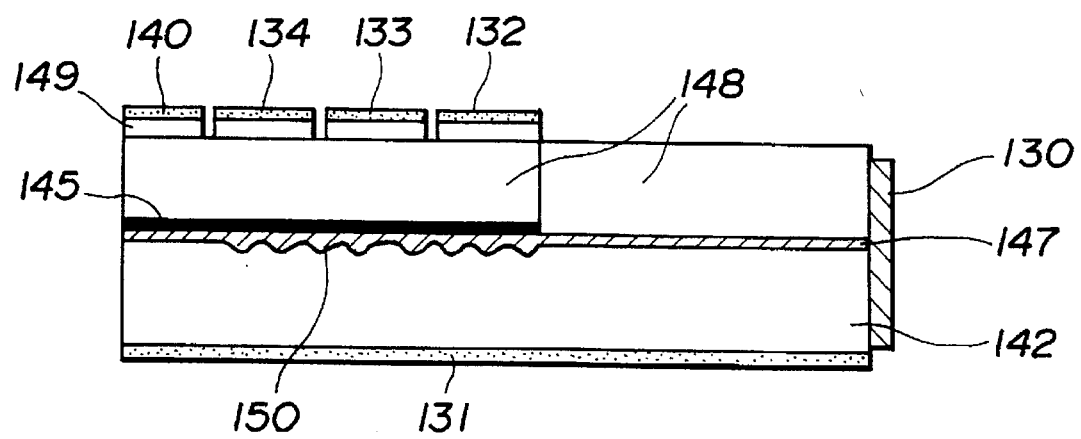
FIG. 21 is a cross-sectional view of the integrated type DFB optical transmitter shown in FIG. 20.

The structure of layers is shown in FIG. 21. In FIG. 20, laser portion and photodetector portion include an InGaAsP light guide layer 147 of 1.3 μm composition formed on an InP substrate 142, an InGaAs/InGaAsP strain multiple quantum well (MQW) active layer 145, an InP cladding layer 148 and an InGaAsP contact layer 149. Waveguide portion 141 includes an InGaAsP light guide layer 147 of 1.3 μm composition formed on the InP substrate 142 and an InP cladding layer 148. The active layer is omitted. In the laser portion, a λ/4 shift first-order diffraction grating 150 is formed on the InP substrate 142, and a three-electrode (132, 133 and 134) structure, in which a λ/4 shift region is centrally located, is constructed. An end surface of the waveguide portion serves as a light emerging end or a light incident end, and an anti-reflection film 130 is deposited thereon.

The above structure is fabricated in the following manner. The λ/4 shift diffraction grating 150 is formed at a desired position of the InP substrate 142, and light guide layer 147, active layer 145, cladding layer 148 and contact layer 149 are grown by an MOCVD method. A portion is etched down to the substrate 142 with the light guide layer being left intact and the cladding layer 148 is regrown by using an MOCVD method again. Then, as shown in FIG. 20, the waveguide 141 of a Y-branch structure is patterned and etching is conducted. Thereafter, high-resistance InP 143 is regrown and buried. Then, electrodes 131, 132, 133, 134 and 149 are formed. After a cleavage process, the anti-reflection film 130 is formed.

Next, the driving method will be described. When the device is driven as a laser, the laser oscillation is performed by a bias current larger than its threshold, and the oscillation wavelength is determined by the current ratio between current injected into the central electrode 133 and current injected into the end electrodes 132 and 134. As described in the seventh embodiment, currents are caused to flow so that oscillation wavelengths of the two lasers differ from each other. Further, the oscillation powers of the lasers are detected by the electrodes 140 as photocurrent of the photodetector integrated at an outermost portion, and its output is fed back to the bias current so that the power is made constant (APC operation). In this case, since the active layer 145 of the photodetector serves as a light absorbing layer, no anti-reflection film for constructing the DFB laser is needed at the end surface on the photodetector side.

Further, since two lasers are integrated on a common semiconductor substrate 142, temperature fluctuation conditions are the same for the two lasers. Therefore, even if oscillation wavelengths of the lasers themselves slightly fluctuate, the wavelength interval hardly fluctuates. Thus, stable transmission and receiving can be readily achieved by the wavelength tracking implemented on the light receiver side. In this embodiment, two light signals are combined in the same polarization state due to the integration structure. Hence, if a difference in the polarization states appears on the receiver side, a polarization control device is needed according to the circumstances.

In the event of filter driving, bias currents are set below the oscillation threshold, and the selection or tuned wavelength is determined by the current ratio between central electrode 133 and the opposite end electrodes 132 and 134. As described in the seventh embodiment, selection wavelengths of the two filters are caused to differ slightly. The signal detection output comprises outputs of the electrodes in the photodetectors, and two such electrode outputs are input into the differential amplifier 110 as described in the seventh embodiment. The demodulation is achieved through the discrimination circuit 124. The structure is also influenced only slightly by temperature.

Tenth Embodiment

Figure 22:
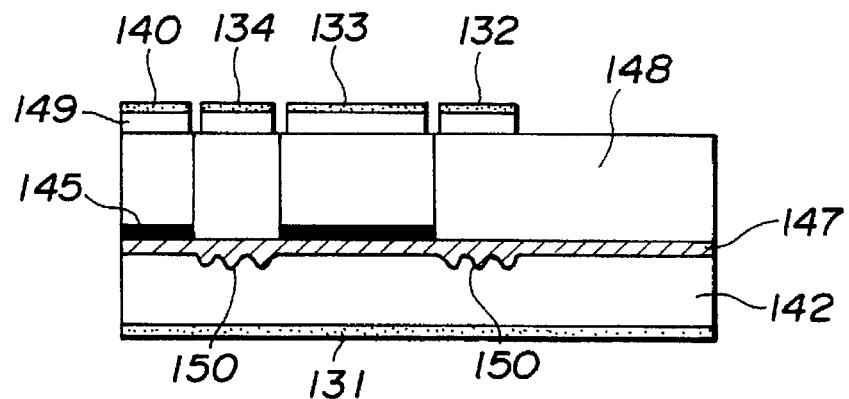
FIG. 22 is a cross-sectional view of a tenth embodiment of the present invention, showing an integrated type DBR optical transmitter.

A tenth embodiment of the present invention, which is an integrated light source or receiver, will be described with reference to FIG. 22. In this embodiment, each of the lasers is a threee-electrode DBR type laser and the changeable wavelength range is approximately 4 nm, which is twice the above-noted value, in order to perform the optical communication described in the seventh embodiment, similar to the ninth embodiment.

The structure of layers is substantially the same as the ninth embodiment. In FIG. 22, portions designated by the same reference numerals as those in FIG. 21 are portions having the same functions.

The structure of the tenth embodiment is fabricated in the following manner. A diffraction grating 150 is formed at desired positions of an InP substrate 142, and thereafter a light guide layer 147, an active layer 145, a cladding layer 148 and a contact layer 149 are grown. A portion is etched down to the active layer 145 and the cladding layer 148 is regrown on the exposed light guide layer 147. Then, a burying process and an electrode forming process are implemented.

Regarding the device driving, the gain is given by the current applied to the central electrode 133 under which the active layer 145 is present, and the oscillation wavelength is changed by the currents applied to the opposite end electrodes 134 and 132 under which the gratings 150 are formed to construct the Bragg resonator. Photocurrent is detected in the region where the electrode 140 is formed.

In the above structure, a 1.55 μm band structure is described, but a 1.3 μm band or a 0.8 μm structure (GaAs/AlGaAs series) may be adopted.

Eleventh Embodiment

Figure 23:
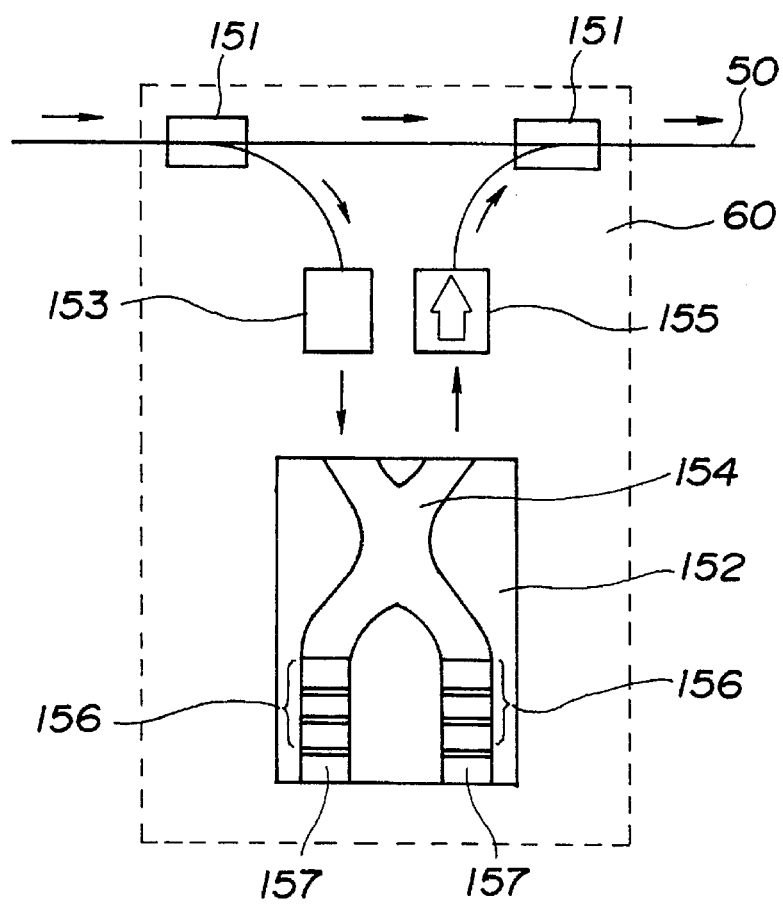
FIG. 23 is a view of an eleventh embodiment, showing an optical node which uses an apparatus of the present invention.

FIG. 23 shows an apparatus for stably receiving an FSK signal and an opto-electric conversion unit (node) which is connected to each terminal when the optical communication system of the present invention is applied to an optical LAN system. FIG. 24 shows, as previously discussed, an example of an optical LAN system in which the node is utilized.

An optical signal is taken into the node 60 through an optical fiber 50 externally connected thereto, and a portion of the signal is caused to enter an integrated receiving device 152 of the ninth or tenth embodiment by a branching device 151. In this apparatus, an integrated waveguide 154 is of an X type in order to separate incident and emitted light. Only an optical signal at a desired wavelength is transmitted and amplified by a tunable filter 156, and the amplified signal is directly detected by a photodetector 157 integrated with the filter 156 to be converted to an electric signal.

On the other hand, when an optical signal is transmitted from the node, light from a laser 156 in the integrated type transmitter apparatus 152 is caused to enter the light transmission line 50 through an isolator 155 and the branching device 151. In the event of transmission of an optical signal, the photodetector 157 serves as a monitoring photodetector. Discrimination between receiving and transmission has been described above in the ninth embodiment. However, when used as a transmitter, light incident from the transmission line will become noise, so that a modulator 153 is inserted to pass light therethrough solely when receiving is conducted. Receiving and transmission are alternately conducted by using time division multiplexing. Thus, the above structure, which has a quite simple structure, can function as a high-performance optical node. Further, a plurality of integrated apparatuses 152 may be arranged so that the changeable wavelength range can be widened or so that the apparatuses can be driven exclusively for transmission and receiving, respectively.

The optical LAN system shown in FIG. 24 is described in the sixth embodiment. In such an optical network system, using the apparatus of the present invention for stably receiving an FSK signal, a wavelength or frequency division multiplexing transmission FSK network, which has a wavelength multiplicity of 14 and no polarization dependency, can be constructed as described in the seventh embodiment.

Twelfth Embodiment

Figure 25:
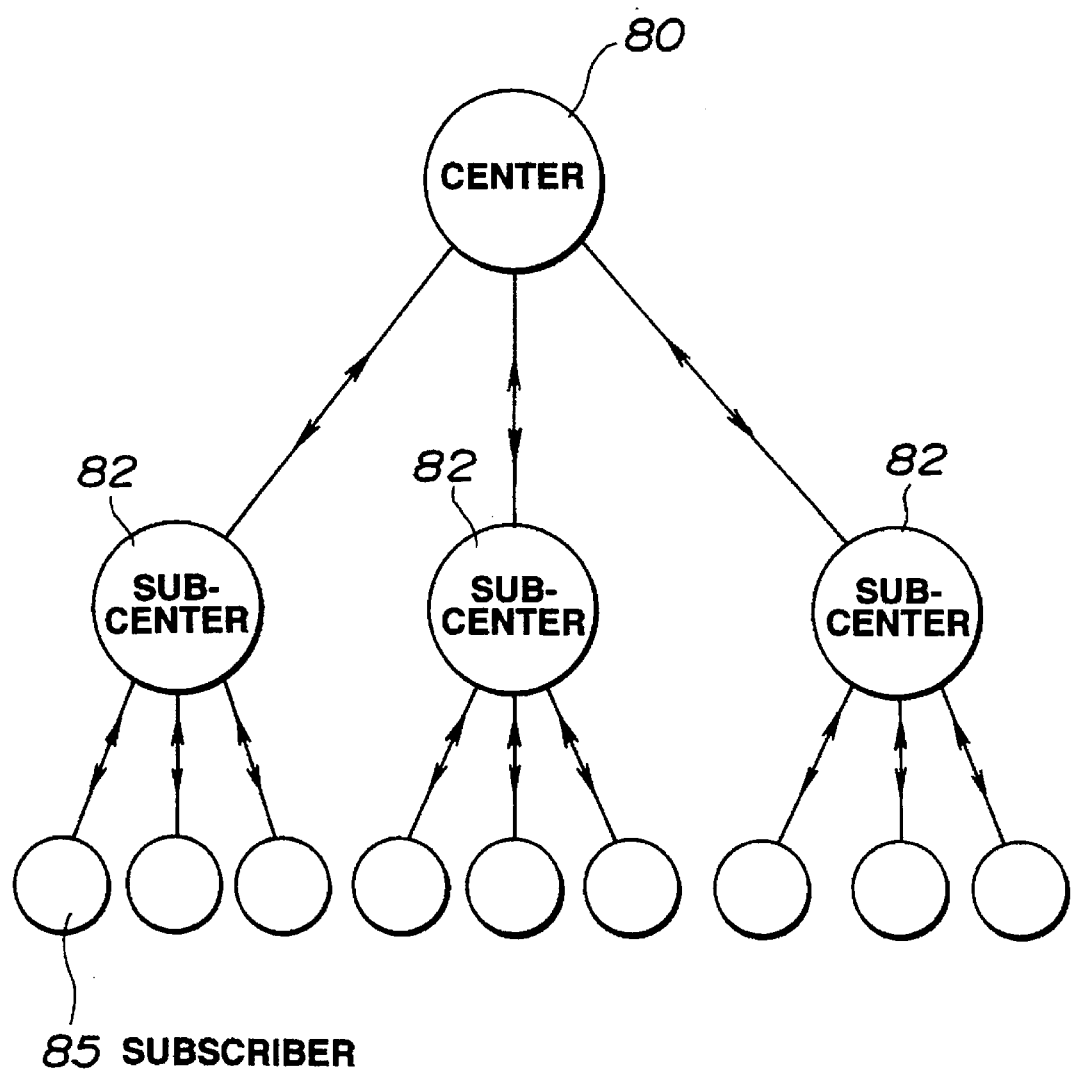
FIG. 25 is a view of an optical cable television (CATV) system according to the present invention.

An optical CATV, as shown in FIG. 25, can be constructed using the apparatus and optical communication system of the present invention. In a CATV center 80 or sub-center 82, the integrated type tunable laser of the present invention is used, and a conventional tunable DFB filter is used on a subscriber side or receiver side 85. Conventionally, it is difficult to use the DFB filter in such a system due to influences of fluctuation of the polarization state of signal light, but it becomes possible according to the present invention.

Further, a bi-directional CATV is possible in the following manner. The subscriber 85 has an external modulator (an example of simple bi-directional optical CATV, see, for example, Ishikawa and Furuta "LiNbO$_3$ Optical Wavelength Modulator For Bi-directional Transmission in Optical CATV Subscriber Systems", OCS 91-82 1991), and a signal from the subscriber 85 is received as a reflected light (reflected light of a signal light transmitted to the subscriber 85) from its external modulator. Thus, a star type network as shown in FIG. 25 is constructed, and highly improved functions of services can be obtained.

According to the present invention, a high-density optical frequency division multiplexing communication system without any polarization dependency can be constructed without necessitating high-degree wavelength control techniques and electronic circuit techniques, such as coherent optical communication techniques.

Especially, as technical burdens are put on the transmitter side rather than the receiver side, a conventional tunable DFB filter and the like can be used on the receiver side. Thus, this system is effectively utilized in optical CATV system and the like. Further, since transmitter and receiver can be obtained by a common apparatus in an FSK network, the present invention is advantageous in cost and productivity.

Except as otherwise disclosed herein, the various components shown in outline or block form in the Figures are individually well known in the optical semiconductor device and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. An optical communication system for communicating over a light transmission line that transmits signals from a transmitter means to a receiver means, said system comprising:

receiver means for receiving modulated light signals as an input from said transmission line, said receiver means comprising a semiconductor filter including a diffraction grating, said filter having transmission wavelengths which differ for a TE mode and a TM mode, said transmission wavelengths being wavelengths passing through said filter, and said filter transmitting at least one light signal having a wavelength that corresponds to one of said transmission wavelengths of said filter, and wherein said at least one light signal is one of the light signals input from said transmission line; and transmitter means for modulating two light signals having different wavelengths which respectively substantially coincide with said TE and TM mode transmission wavelengths of said filter, using a common modulation signal, and for transmitting the modulated light signals to said transmission line.

2. An optical communicating system according to claim 1, wherein said filter comprises a semiconductor waveguide type filter, which can provide transmission gain for said transmitted modulated light signals.

3. An optical communication system according to claim 1, wherein said light transmission line comprises an optical fiber.

4. An optical communication system according to claim 1, further comprising adjusting means for adjusting the relation between polarization states of the two light signals so that the two light signals are coupled to said filter in the same polarization state when said filter receives the transmitted signals.

5. An optical communication system according to claim 4, wherein said adjusting means comprises means for combining the two light signals in the same polarization state and for transmitting the combined light signals to said light transmission line.

6. An optical communication system according to claim 1, wherein said filter comprises means for amplifying the TE mode wavelength with an amplification factor equal to an amplification factor for the TM mode wavelength of said filter.

7. An optical communication system according to claim 1, wherein said filter comprises a distributed feedback type filter.

8. An optical communication system according to claim 1, wherein said filter comprises a distributed Bragg reflector type filter.

9. An optical communication system according to claim 1, wherein said filter comprises a plurality of electrodes, and wherein said filter comprises means for changing a transmission wavelength of said filter by controlling currents injected through said plurality of electrodes.

10. An optical communication system according to claim 1, wherein said transmitter means comprises a distributed feedback type semiconductor laser.

11. An optical communication system according to claim 1, wherein said transmitter means comprises a distributed Bragg reflector type semiconductor laser.

12. An optical communication system according to claim 1, wherein said transmitter means comprises a semiconductor laser having a plurality of electrodes, and further comprises means for changing an oscillation wavelength of said laser by controlling currents injected through said plurality of electrodes.

13. An optical communication system according to claim 1, wherein said light transmission line comprises an optical fiber, said transmitter means comprises means for transmitting light signals at a plurality of pairs of different wavelengths to said optical fiber, the pairs of wavelengths being respectively modulated by a plurality of modulation signals, and said filter comprises means for selecting the modulated lights at a desired pair of wavelengths to achieve wavelength division multiplexing transmission.

14. An optical communication system according to claim 1, wherein said transmitter means comprises an external intensity modulator for intensity-modulating the light signals, said communication system further comprising a photodetector for directly detecting the amplified and demultiplexed light signals at a desired pair of wavelengths from said filter.

15. An optical communication system according to claim 14, further comprising: an oscillator for generating a low frequency minute signal, the minute signal being superimposed on a DC driving current of the waveguide filter; a low pass filter; and means for effecting a synchronous detection between an electric signal obtained by said photodetector and the minute signal from said oscillator to generate a synchronous detection signal, and for performing a negative feedback of the synchronous detection signal to the DC driving current of the waveguide filter through the low pass filter so that the transmission wavelengths of the waveguide filter are tuned and stabilized at a desired pair of wavelengths.

16. An optical communication system according to claim 1, wherein said transmitter means comprises a semiconductor laser and modulation means for superimposing a modulation signal on an injection current of the laser to effect a direct frequency modulation, said communication system further comprising a photodetector for directly detecting a modulated transmission intensity which is converted from a modulated frequency using a frequency discrimination characteristic of a wavelength transmission spectrum of said filter.

17. An optical communication system according to claim 16, wherein the modulation means comprises means for modulating the injection current to effect a direct frequency shift keying modulation for code communication.

18. An optical communication system according to claim 1, wherein said transmitter means comprises a semiconductor laser and modulation means for superimposing a modulation signal on an injection current of said laser to effect a direct intensity modulation, said communication system further comprising a photodetector for directly detecting said amplified and demultiplexed light from the filter.

19. An optical communication system according to claim 1, wherein said transmitter means comprises first and second light sources, and said first light source outputs one of the two light signals and said second light source outputs another of the two light signals.

20. An optical communication system according to claim 19, wherein said transmitter means modulates intensity of light output from said first light source and intensity of light output from said second light source respectively with the common modulation signal.

21. An optical communication system according to claim 19, wherein said transmitter means performs FSK modulation of the light output from said first light source and the light output from said second light source respectively with the common modulation signal, the light output from said first light source, by being FSK-modulated with the common modulation signal, has a first mark wavelength which becomes a first mark signal of the FSK modulation and a first space wavelength which becomes a first space signal of the FSK modulation, the light output from said second light source, by being FSK-modulated with the common modulation signal, has a second mark wavelength which becomes a second mark signal of the FSK modulation and a second space wavelength which becomes a second space signal of the FSK modulation, and at least one of said first and second mark wavelengths, substantially coincide with, respectively, said TE and TM mode transmission wavelengths of said semiconductor filter, and said first and second space wavelengths substantially coincide, respectively, with said TE and TM mode transmission wavelengths of said semiconductor filter.

22. An optical communication system according to claim 21, wherein said receiver means comprises two semiconductor filters, one of said two semiconductor filters having TE and TM transmission wavelengths which substantially coincide with, respectively, said first and second mark wavelengths, and another of said two semiconductor filters having TE and TM transmission wavelengths which substantially coincide with, respectively, said first and second space wavelengths.

23. A method in an optical communication system for performing optical communication over a light transmission line that transmits signals from a transmitter means to a receiver means, the receiver means comprising a semiconductor filter including a diffraction grating, said filter in which transmission wavelengths differ for a TE mode and a TM mode, and said transmission wavelengths being wavelengths passing through said filter, said receiver means transmitting light signals whose wavelength is a function of said transmission wavelengths, comprising the steps of:

modulating two light signals having different wavelengths wherein said wavelengths respectively substantially coincide with said TE mode and said TM mode transmission wavelengths of the filter with a common modulation signal, transmitting the modulated light signals to the transmission line, transmitting a light signal of a transmission wavelength of said filter in a receiver means, and converting a light signal transmitted from said filter into an electric signal.

24. A method according to claim 23, wherein said method further comprises a step of orienting polarizations of the two light signals to have a predetermined angle relative to each other prior to transmitting the modulated light signals.

25. A method according to claim 23, wherein the receiver means includes two filters with transmission wavelengths that are different from each other, and wherein said modulating step comprises performing a frequency shift modulation wherein space and mark wavelengths of a frequency shift keying substantially correspond to the transmission wavelengths of the two filters.

* * * * *

UNITED STATES PATENT AND TRADEMARK OFFICE
CERTIFICATE OF CORRECTION

PATENT NO. : 5,654,814  
DATED : August 5, 1997  
INVENTOR(S) : Ouchi et al.

Page 1 of 2

It is certified that error appears in the above-identified patent and that said Letters Patent is hereby corrected as shown below:

COLUMN 3:

Line 32, "FSK transmission A" should read --FSK transmission. A--.

COLUMN 5:

Line 34, "filter" should read --filters--;

Line 44, "fuctions" should read --functions--;

Line 47, "provide" should read --provided--; and

Line 66, "fuctions" should read --functions--.

COLUMN 7:

Line 28, "With" should read --with--; and

Line 52, "showing integrated" should read --showing an integrated--.

UNITED STATES PATENT AND TRADEMARK OFFICE
CERTIFICATE OF CORRECTION

PATENT NO. : 5,654,814
DATED : August 5, 1997
INVENTOR(S) : Ouchi et al.

It is certified that error appears in the above-identified patent and that said Letters Patent is hereby corrected as shown below:

COLUMN 17:

Line 39, "threee- --" should read --three- --.

COLUMN 19:

Line 11, "system" should read --systems--.

Signed and Sealed this

Twelfth Day of May, 1998

Attest:

BRUCE LEHMAN

*Attesting Officer*    *Commissioner of Patents and Trademarks*